US009559486B2

(12) United States Patent
Roos et al.

(10) Patent No.: US 9,559,486 B2
(45) Date of Patent: Jan. 31, 2017

(54) PRECISE BROADBAND FREQUENCY MODULATED LASER

(71) Applicants: Peter A. Roos, Bozeman, MT (US); Randy R. Reibel, Bozeman, MT (US); Brant Kaylor, Bozeman, MT (US); Zeb Barber, Bozeman, MT (US); William Randall Babbitt, Bozeman, MT (US)

(72) Inventors: Peter A. Roos, Bozeman, MT (US); Randy R. Reibel, Bozeman, MT (US); Brant Kaylor, Bozeman, MT (US); Zeb Barber, Bozeman, MT (US); William Randall Babbitt, Bozeman, MT (US)

(73) Assignees: Montana State University, Bozeman, MT (US); Bridger Photonics, Inc., Bozeman, MT (US)

( * ) Notice: Subject to any disclaimer, the term of this patent is extended or adjusted under 35 U.S.C. 154(b) by 0 days.

(21) Appl. No.: 14/538,789

(22) Filed: Nov. 11, 2014

(65) Prior Publication Data

US 2015/0071315 A1    Mar. 12, 2015

Related U.S. Application Data

(63) Continuation of application No. 13/318,135, filed as application No. PCT/US2010/033021 on Apr. 29, 2010, now Pat. No. 8,913,636.

(Continued)

(51) Int. Cl.
*H01S 3/10*    (2006.01)
*H01S 3/13*    (2006.01)
(Continued)

(52) U.S. Cl.
CPC .............. *H01S 3/10* (2013.01); *H01S 3/1305* (2013.01); *H01S 5/0683* (2013.01); *H01S 5/141* (2013.01);
(Continued)

(58) Field of Classification Search
CPC .......... H01S 3/10; H01S 5/141; H01S 5/0683; H01S 3/1305; H01S 5/143; H01S 5/06837; G01S 7/4911; G01S 7/4814
See application file for complete search history.

(56) References Cited

U.S. PATENT DOCUMENTS 5,157,677 A    10/1992  Narhi et al.
5,548,402 A *   8/1996  Nogiwa .............. H01S 5/06258
                                            356/477

(Continued)

FOREIGN PATENT DOCUMENTS

FR        2940540       6/2010
WO    WO 2010/072535    7/2010

OTHER PUBLICATIONS

Communication pursuant to Rule 114(2) EPC from European Application No. 10770357.1, dated Feb. 24, 2012, 8 pages.

(Continued)

*Primary Examiner* — Yuanda Zhang
(74) *Attorney, Agent, or Firm* — Klarquist Sparkman, LLP

(57) ABSTRACT

A method and apparatus are described including a laser with a plurality of internal or external actuators for affecting an optical frequency of light output by the laser, wherein the plurality of actuators have a corresponding plurality of different frequency response bands for changing optical properties of the laser and a corresponding plurality of actuation ranges of optical frequencies affected. Also included is an optical detector, and a plurality of optical (Continued)

paths configured to direct light output by the laser onto the detector. A laser controller is configured to provide a plurality of inputs to the plurality of actuators based on a detector signal output from the optical detector and the corresponding frequency response bands and actuation ranges.

8 Claims, 21 Drawing Sheets

Related U.S. Application Data

(60) Provisional application No. 61/173,947, filed on Apr. 29, 2009.

(51) Int. Cl.
    *H01S 5/0683*     (2006.01)
    *H01S 5/14*     (2006.01)
    *G01S 7/481*     (2006.01)
    *G01S 7/491*     (2006.01)

(52) U.S. Cl.
    CPC ............ *G01S 7/4814* (2013.01); *G01S 7/4911* (2013.01); *H01S 5/06837* (2013.01); *H01S 5/143* (2013.01)

(56) References Cited

U.S. PATENT DOCUMENTS

| | | | |
|---|---|---|---|
| 6,034,976 A | 3/2000 | Mossberg et al. | |
| 6,064,681 A * | 5/2000 | Ackerman | H04B 10/572 |
| | | | 372/20 |
| 6,643,299 B1 | 11/2003 | Lin | |
| 2001/0050929 A1 | 12/2001 | Dietrich et al. | |
| 2003/0007523 A1 * | 1/2003 | Chapman | H01S 5/141 |
| | | | 372/20 |
| 2003/0025913 A1 | 2/2003 | Izatt et al. | |
| 2003/0147434 A1 | 8/2003 | Hong et al. | |
| 2005/0185681 A1 * | 8/2005 | Ilchenko | H01S 5/146 |
| | | | 372/20 |
| 2006/0062260 A1 | 3/2006 | Marron et al. | |
| 2007/0133647 A1 * | 6/2007 | Daiber | H01S 5/026 |
| | | | 372/99 |
| 2007/0146721 A1 | 6/2007 | Barcelos et al. | |
| 2007/0171407 A1 * | 7/2007 | Cole | G01J 3/4338 |
| | | | 356/300 |
| 2009/0135860 A1 * | 5/2009 | Maleki | H01S 3/1305 |
| | | | 372/20 |
| 2009/0174931 A1 | 7/2009 | Huber et al. | |
| 2010/0085992 A1 | 4/2010 | Rakuljic et al. | |
| 2010/0225897 A1 | 9/2010 | Fermann et al. | |

OTHER PUBLICATIONS

Gorju et al., "Experimental investigation of deterministic and stochastic frequency noises of a rapidly frequency chirped laser," *Eur. Phys. J. Appl. Phys.*, 30:175-183 (2005).

Iiyama et al., "Linearizing optical frequency-sweep of a laser diode for FMCW reflectometry," *Journal of Lightwave Technology*, 14:173-178 (Feb. 1996).

International Preliminary Report on Patentability from International Application No. PCT/US2010/033021, dated Nov. 1, 2011, 4 pages.

International Search Report and Written Opinion from International Application No. PCT/US2010/033021, dated Dec. 24, 2010, 6 pages.

* cited by examiner

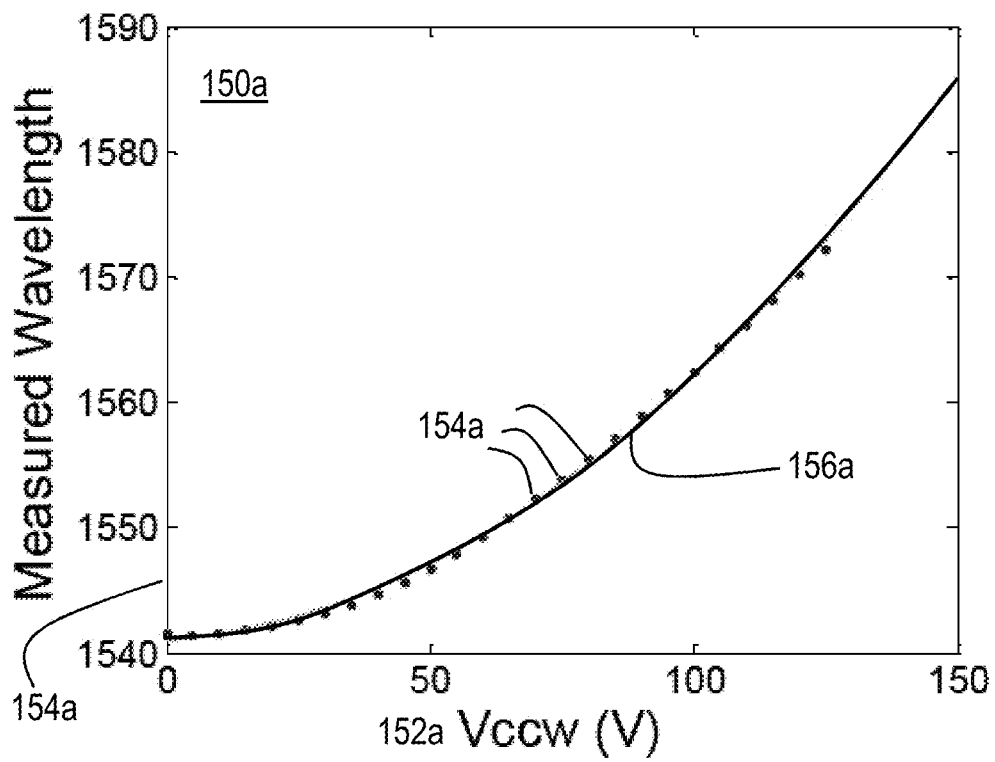
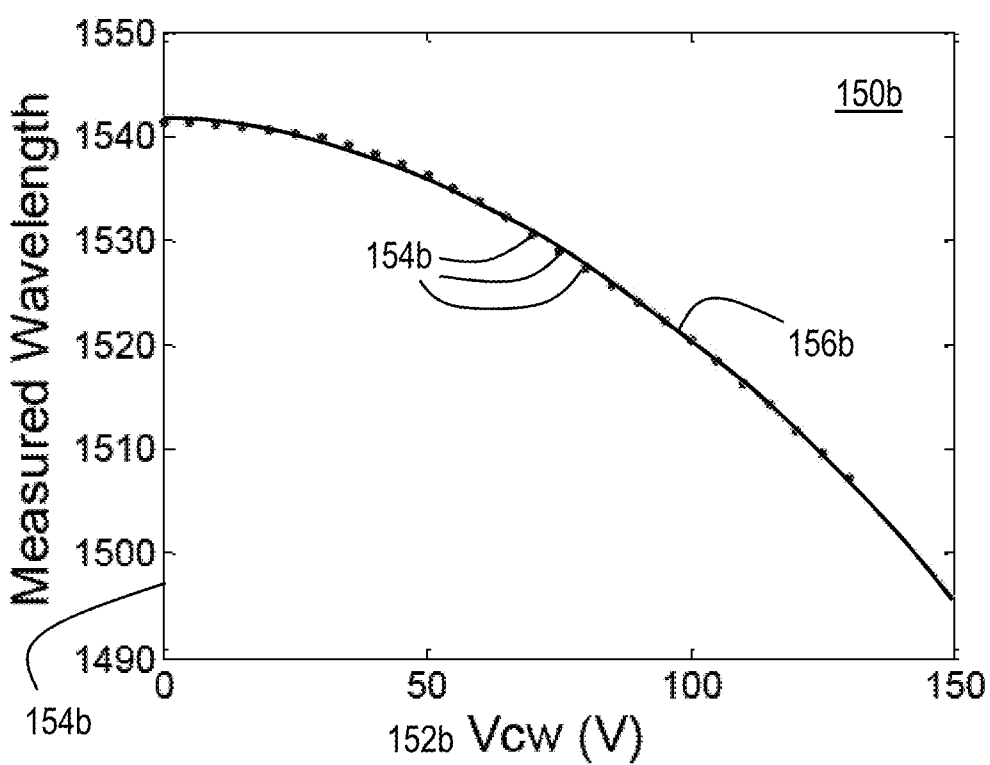

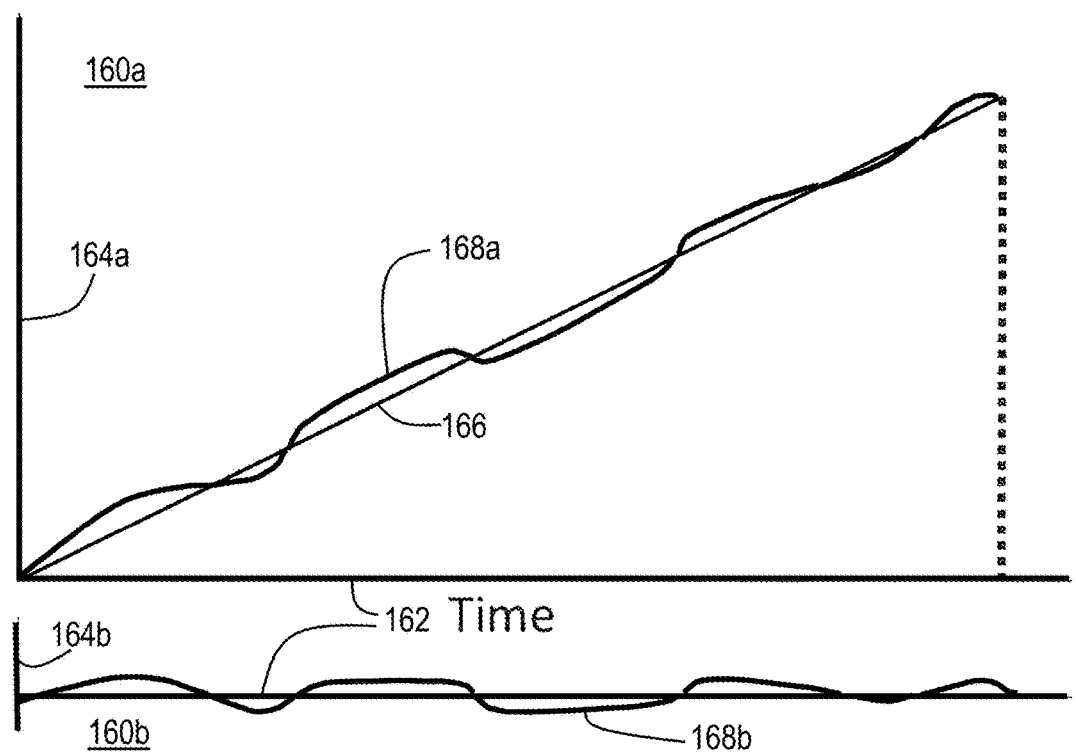

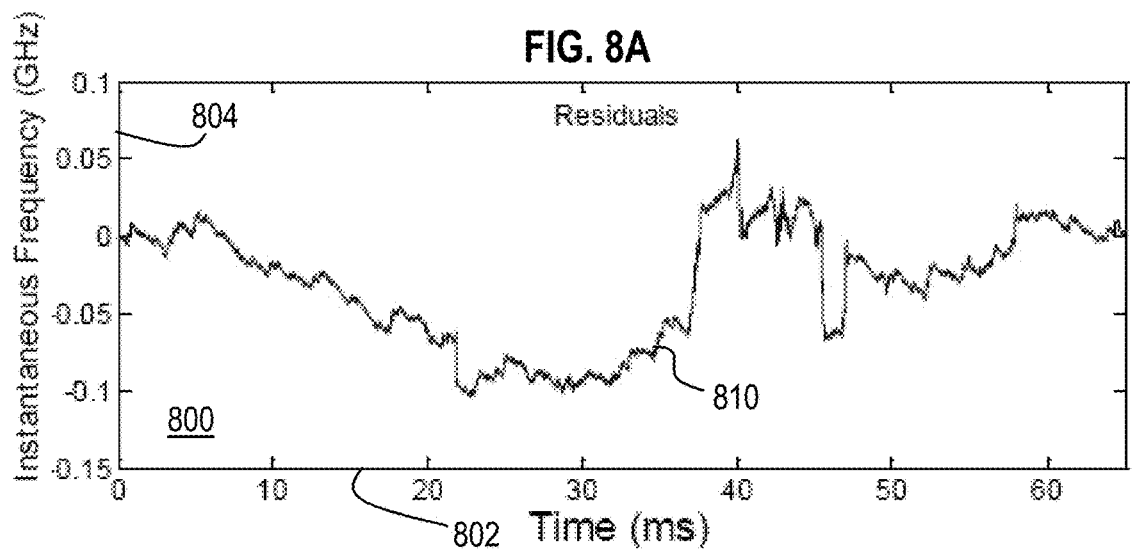
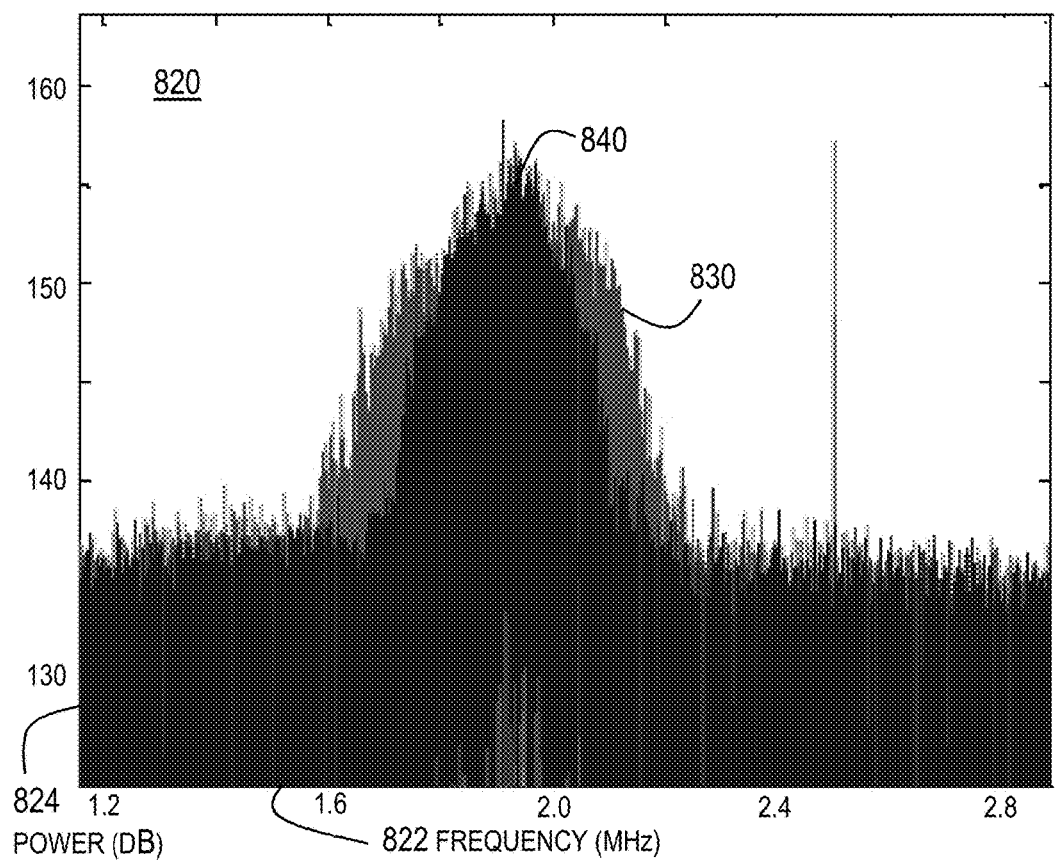

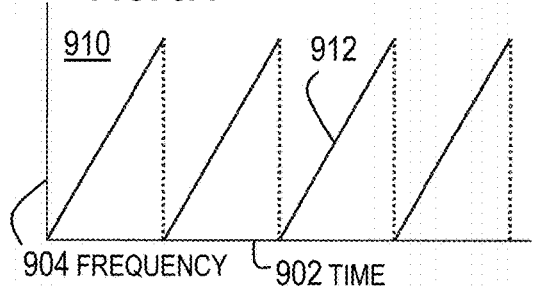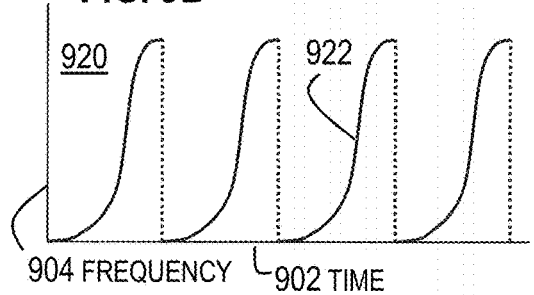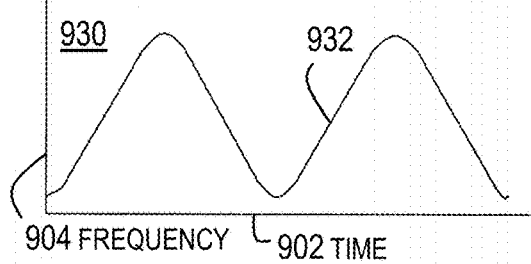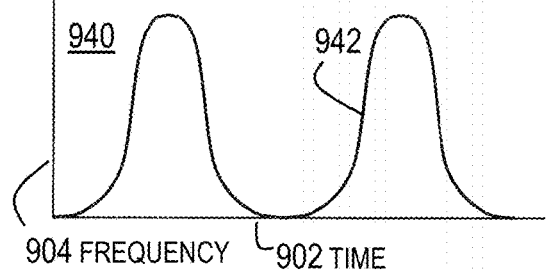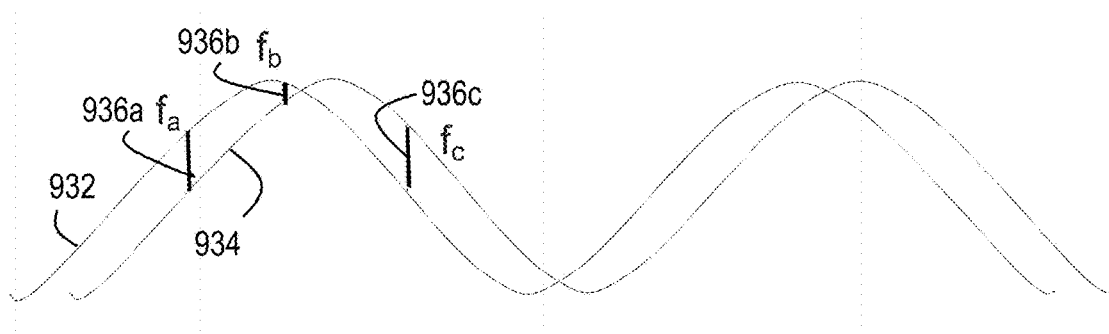

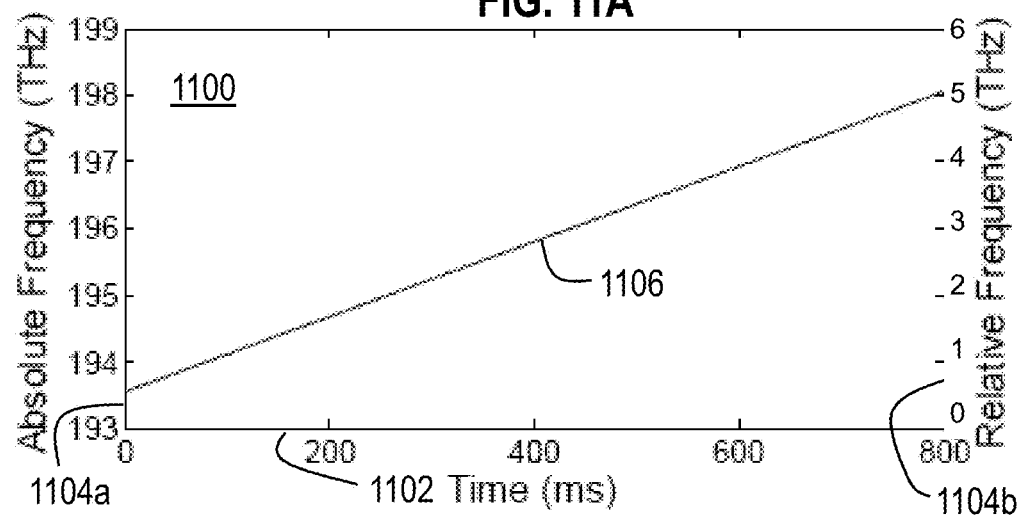
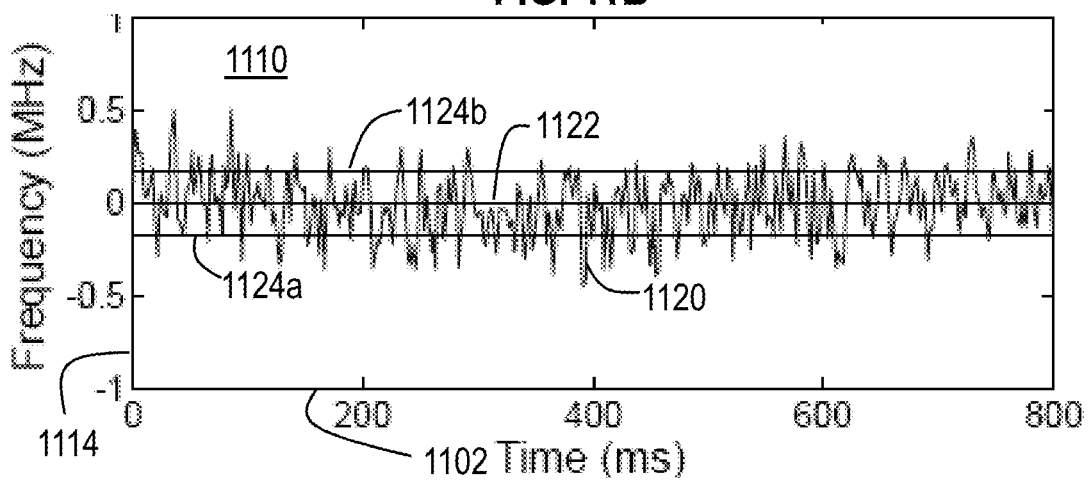
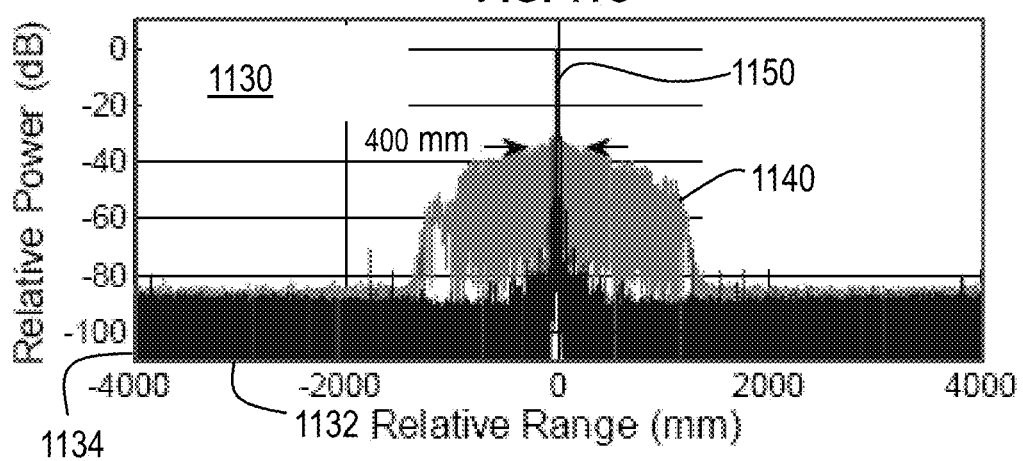

PRECISE BROADBAND FREQUENCY MODULATED LASER

CROSS-REFERENCE TO RELATED APPLICATIONS

This application claims benefit of Provisional Appln. 61/173,947, filed Apr. 29, 2009, under 35 U.S.C. §119(e); and to international application PCT/US2010/033021, filed Apr. 29, 2010; and to utility application Ser. No. 13/318,135, filed Oct. 28, 2011.

STATEMENT OF GOVERNMENTAL INTEREST

This invention was made with government support under Contract No. NRO-000-08-C-0158 awarded by the National Reconnaissance Office. The government has certain rights in the invention.

BACKGROUND

Many laser applications require the laser's frequency to be changed in time ("frequency modulated") in an extremely controlled and predictable manner over large optical frequency bandwidths. Many of these applications require the optical frequency to change linearly and monotonically in time (to form a "linear frequency chirp," called simply a "chirp" hereinafter). For instance, researchers have actively linearized an optical frequency radio frequency (RF) sideband to improve the performance of frequency-modulated, continuous-wave (FM-CW) laser detection and ranging (LADAR). Other researchers have actively linearized the carrier optical frequency for reading out spectral information recorded in optical crystal transitions.

Previous work has demonstrated techniques for providing feedback through circuits that drive a laser to provide stable, highly linear laser output for low optical bandwidth systems. This previous work exhibits frequency tuning, including highly linear chirps, with bandwidths of up to 10 gigaHertz (GHz, 1 GHz=$10^9$ cycles per second, also called Hertz and abbreviated Hz).

SUMMARY

Previous techniques for precise laser tuning are observed to break down for extremely large tuning bandwidths, such as a bandwidth greater than 50 GHz, which is 5 times more frequency tuning bandwidth than demonstrated by the previous work. Broadband chirps greater than 50 GHz have been produced but with deviations from linearity of about 1 percent (%) or more. Therefore, there is a need for a broadband frequency modulated laser that is highly precise and accurate for bandwidths greater than about 50 GHz. For example there is a need for a broadband chirped laser that produces a chirp that deviates from linearity by less than 1% for bandwidths greater than 50 GHz.

In one set of embodiments, an apparatus includes a tunable laser having a plurality of drive inputs for affecting an optical frequency of light output by the laser. The plurality of drive inputs have a corresponding plurality of different frequency response bands for changing optical properties of the tunable laser and a corresponding plurality of actuation ranges of optical frequencies affected. The apparatus also includes an optical detector; and a plurality of optical paths configured to direct light output by the laser onto the detector. The apparatus further includes a laser controller configured to provide a plurality of inputs to the plurality of drive inputs based on a detector signal output from the optical detector and the corresponding frequency response bands and actuation ranges.

In another set of embodiments, an apparatus includes a laser, an optical detector, and a plurality of optical paths. The optical paths are configured to direct light output by the laser onto the detector. The apparatus also includes an optical actuator in an optical path between the laser and the plurality of optical paths. The optical actuator is configured to affect the optical frequency of light transmitted into the plurality of optical paths based on a first signal input to the optical actuator. The apparatus further includes a laser controller configured to provide the first signal input to the optical actuator based on the detector signal output from the optical detector.

In another set of embodiments, an apparatus includes a tunable laser having one or more drive inputs for affecting an optical frequency of light output by the laser, and an electrical sweep generator configured to generate a series of signals that cause the tunable laser to produce a waveform with alternating increasing and decreasing optical frequencies. The apparatus includes a connection configured to input the series of signals output from the sweep generator into a first drive input. The apparatus also includes an optical detector, and a plurality of optical paths configured to direct light output by the laser onto the detector. Still further, the apparatus includes a laser controller configured to provide to a second drive input a loopback signal based on a detector signal output from the optical detector.

In another embodiment, a ranging system includes a tunable laser source that produces a substantively linear chirp with accuracy better than about one percent over a bandwidth greater than about 50 GHz. The system also includes an optical detector and a first optical path configured to direct light output by the laser onto the detector, a second optical path configured to direct light output by the laser toward a target, and a third optical path configured to direct light received from the target onto the detector. A processor determines range to one or more portions of the target based on a detector signal output from the optical detector.

In various other embodiments, a method or computer-readable storage medium is configured to perform functions of, or operate, one or more of the above components.

Still other aspects, features, and advantages of the invention are readily apparent from the following detailed description, simply by illustrating a number of particular embodiments and implementations, including the best mode contemplated for carrying out the invention. The invention is also capable of other and different embodiments, and its several details can be modified in various obvious respects, all without departing from the spirit and scope of the invention. Accordingly, the drawings and description are to be regarded as illustrative in nature, and not as restrictive.

BRIEF DESCRIPTION OF THE DRAWINGS

The embodiments of the invention are illustrated by way of example, and not by way of limitation, in the figures of the accompanying drawings, in which:

FIG. 1F and FIG. 1G are graphs that illustrate an example analytical fit to a non-linear response of the laser source of FIG. 1D and FIG. 1E, according to an embodiment;

FIG. 1H is a pair of graphs that illustrates example systematic errors, according to an embodiment;

FIG. 8A is a graph that illustrates example deviations from ideal chirp output for passively compensated systematic errors, according to an embodiment;

FIG. 8B is a graph that illustrates an example effect of passively compensating for systematic errors, according to an embodiment;

FIG. 9A through FIG. 9E are graphs that illustrate example outputs from a laser based on driving functions, according to various embodiments;

FIG. 11A is a graph that illustrates an example broadband precise chirp, according to an embodiment;

FIG. 11B is a graph that illustrates deviations from an ideal chirp output, according to an embodiment;

FIG. 11C and FIG. 11D are graphs that illustrate example effects on active range determination by compensating the chirp for multiple contributions to non-linearity, according to an embodiment;

DETAILED DESCRIPTION OF EXAMPLE EMBODIMENTS

Figure 1A:
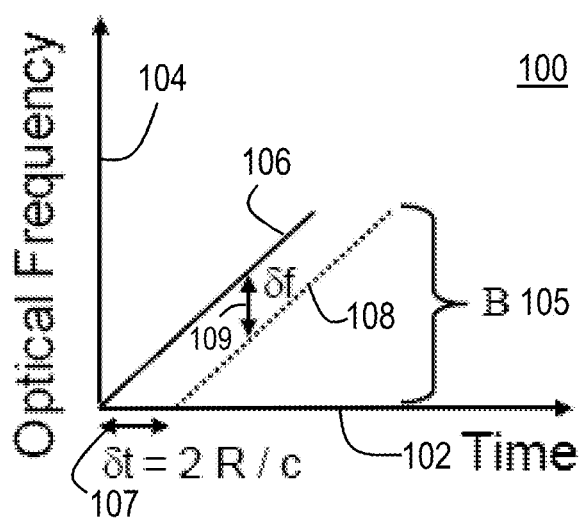
FIG. 1A is a graph of optical frequency versus time for two chirps, one of which is time delayed relative to the other, according to one embodiment.

An apparatus, method and software are disclosed for providing precise and/or accurate broadband frequency modulated optical waveforms. In the following description, for the purposes of explanation, numerous specific details are set forth in order to provide a thorough understanding of the embodiments of the invention. It is apparent, however, to one skilled in the art that the embodiments of the invention may be practiced without these specific details or with an equivalent arrangement. In other instances, well-known structures and devices are shown in block diagram form in order to avoid unnecessarily obscuring the embodiments of the invention.

Although several embodiments of the invention are discussed with respect to a broadband chirped laser for frequency modulated continuous wave (FMCW) laser detection and ranging (LADAR) applications, embodiments of the invention are not limited to this context. It is explicitly anticipated that the broadband chirped laser is useful in many applications, including scanning, imaging, time delay determination, dimensional metrology, surface characterization, arbitrary waveform generation, TeraHertz (THz, 1 THz=$10^{12}$ Hz) generation through nonlinear processes such as photomixing, or coherent spectral readout/analysis of unknown optical or TeraHertz signals, among others, alone or in some combination. It is further anticipated that non-linear or non-monotonic precise and accurate broadband modulated optical waveforms are generated and used in various applications.

Some general embodiments are described at a high level first. More details for various components described herein and specific embodiments are provided below. Additional information, measurements and theory that underpin these embodiments in the context of high precision ranging applications are also provided in more detail below.

As used throughout, the terms "optical wave," "optical beam," "laser beam," and "beam" are used interchangeably to describe a focused or parallel or mixed, propagating optical beam at a given frequency, and waveform to describe the optical frequency as a function of time. An optical path is a trajectory followed by an optical wave through one or more optical components in 3 dimensional coordinate space, and may include a vacuum, gas, glass, glass fiber, fiber isolator, lens, mirror, beam splitter, combiner, polarizer, diffraction grating, optical filter, optical amplifier, phase or frequency actuator, or any other optical component that directs or affects the direction, frequency, speed, strength or any other property of the propagating optical wave, alone or in some combination. A linearized sweep or linearized chirp refers to an optical waveform with a more accurately controlled linear frequency or phase over the entire bandwidth of the optical waveform than is available in the prior art. A precise broadband sweep or chirp refers to an optical waveform with a more precisely controlled arbitrary frequency or phase over the entire bandwidth of the optical waveform than is available in the prior art.

Prior art approaches to producing linear chirps rely on heterodyne detection, which splits a portion of a laser's output beam into two optical paths that converge on the same detector. A controlled frequency difference is introduced into one path, usually by adding a controlled time delay to a frequency modulated optical wave. The frequency difference produces a low-frequency (typically, but not necessarily less than 100 MHz) heterodyne beat at the detector which is relatively easy to detect and process with conventional electronic components. According to various embodiments, one or more additional components or steps, alone or in some combination, are taken over prior art approaches to achieve more precise and/or accurate control of optical frequency modulation, especially over large bandwidths.

FIG. 1A is a graph 100 of optical frequency versus time for two chirps, one of which is time delayed relative to the other, according to one embodiment. The horizontal axis 102 is time in relative units, increasing to the right. The vertical axis 104 is optical frequency in relative units increasing upward. Linear optical chirp 106 comprises an optical frequency that increases linearly with time with a slope given by a chirp rate κ that is constant. The full optical frequency range is called the bandwidth, B 105. Linear optical chirp 108 is a replica of liner optical chirp 106 at a later time, after a time delay of δt 107, such as after reflection from a target. FIG. 1A thus depicts chirps for an established technique that is employed to measure the difference in the time of arrival between any two optical chirps to infer a spatial separation of the target. The technique is known as FMCW RADAR, which is a method of stretched processing, to the microwave radar community. In the optical community, it is often referred to as a swept-source coherent heterodyne or a frequency-modulated continuous-wave (FMCW) chirped LADAR. In such applications, the time delay is determined by double the range (R) to the target divided by the speed of light (c) in the medium.

The time delay 107 between any two optically coherent chirps can be obtained by heterodyning the two chirps on a photodetector. The photodetector records a time series of intensity that includes a sinusoidal component at a heterodyne beat frequency given by the frequency difference δf 108. The frequency, δf 108, of the resulting beat is determined by the chirp rate, κ, and the delay time, δt 107 between the two chirps. The time delay 107 between the two waveforms (and corresponding range to target, R) can be accurately measured by taking the Fourier transform of the digitized output from the photodetector to obtain the frequency of the beat note, or by otherwise determining the frequency of the sinusoidal component.

Figure 1B:
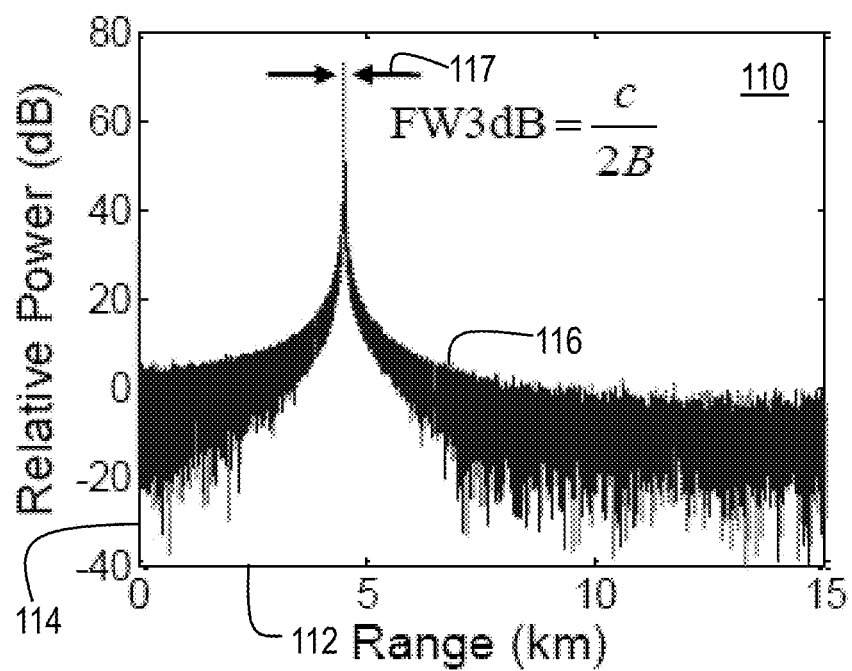
FIG. 1B is a graph of range determination (distance or length metrology) using chirps, according to one embodiment.

FIG. 1B is a graph 110 of active range determination (metrology) using FMCW, according to one embodiment. The horizontal axis is range in kilometers (km, 1 km=$10^6$ meters) based on frequency of the beat note times the speed of light in the medium (c). The vertical axis 114 is relative power in decibels (dB, 1 dB=10 times the log of the ratio of power relative to a reference power). Trace 116 is the Fourier transform of the output from the photodetector. A peak 117 is detected at a beat frequency δf that corresponds to a range of almost 5 km. The full width at 3 dB below the peak (FW3 dB) resolution is inversely proportional to the full bandwidth of the chirp, B. It is important to note that the advantage of this technique is that full chirp bandwidth resolutions are achieved while utilizing much smaller photodetector and digitizer bandwidths than B.

Current technologies provide moderate resolution LADAR that can make measurements over a relatively short window of ranges. However, for ultra-high-resolution applications that require measurement over more than a few cm up to over 100 meters, the required extremely linear, high-bandwidth, phase-stable optical frequency chirps have proven exceedingly difficult to generate. In fact, this obstacle has been singled out as the significant impediment to successful implementation of high-resolution synthetic aperture LADAR.

Figure 1C:
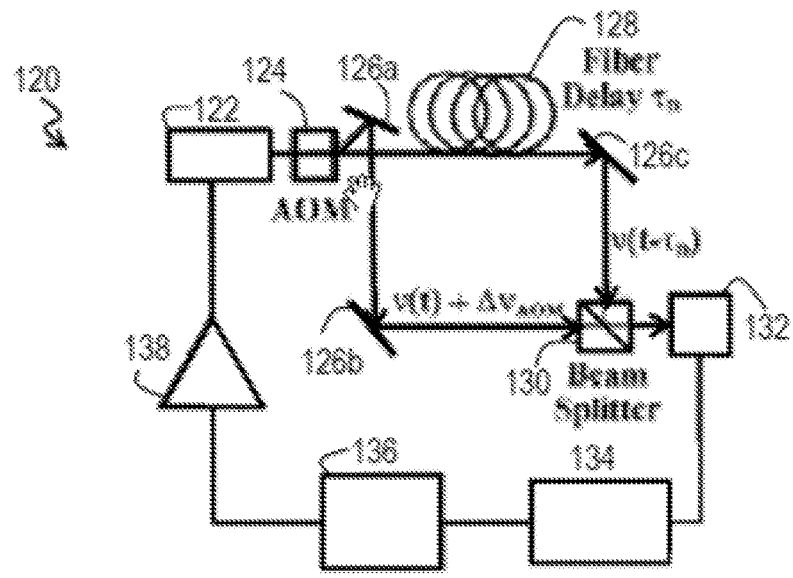
FIG. 1C is a diagram of apparatus to produce a limited band optical waveform in the prior art.

A recent approach using a feedback loop is given in U.S. Pat. No. 6,034,976 by T. W. Mossberg, C. Greiner, B. Boggs, entitled "Method and apparatus for laser frequency stabilization," issued Mar. 7, 2000 (hereinafter Mossberg). FIG. 1C is a diagram of apparatus 120 to produce a limited band FMCW in the prior art (Mossberg). The apparatus 120 includes a frequency controlled laser 122, an acousto-optical modulator (AOM) 124 to split output from the laser into two optical paths and add an offset frequency, a fiber delay loop 128 in one path, mirrors 126a, 126b, 126c (collectively referenced hereinafter as mirrors 126) and beamsplitter 130 to cause the two optical paths to converge on photodetector 132. The optical paths are indicated by thick arrows. The photodetector 132 outputs an electrical signal indicated by thin line segments. The apparatus 120 also includes a feedback loop that comprises a phase locked loop (PLL) generator 134, well known in the art, to generate an output electrical signal that is proportional to the phase difference between the input heterodyne beat from photodetector 132 and an internal stable frequency reference. The apparatus 120 feedback loop also includes a temporal integrator 136 and amplifier 138 that drives the laser 122 to output a particular frequency based on an input from the PLL generator 134. The beam output by the laser has a waveform given by time varying frequency ν(t), and the AOM 124 introduces an additional optical frequency offset $\Delta\nu_{AOM}$. The fiber delay 128 introduces a delay of $\tau_D$, resulting in a beat frequency at photodetector 132 of $\tau_D+\Delta\nu_{AOM}$. The term $\Delta\nu_{AOM}$ moves the beat frequency away from low frequencies near zero where there are substantial noise components. Here and in the mathematical treatment below, it is assumed for simplicity that $\tau_D$ refers to the time delay introduced in one path and that the other path has zero time delay. However, this can be generalized to cases where there is time delay in both paths, or neither path and $\tau_D$ represents the time delay difference between the paths.

In Mossberg, it was shown that by varying the frequency of the PLL generator 134, the beat frequency could be made to vary in an arbitrary but controlled manner such that the variable-wavelength laser's frequency could sweep as an arbitrary function of time. Thus, the laser's optical frequency could be made to vary in a controlled nonlinear manner. Mossberg also showed that by setting the PLL generator 134 frequency to zero, the laser's optical frequency did not change in time and the linewidth of the laser, which results from the laser's phase and frequency noise, could be suppressed when the feedback loop was engaged.

Previous optical frequency waveform stabilization approaches involving the self-heterodyne technique, including Mossberg, employ lasers with relatively small tuning ranges (less than about 10 GHz). Widely tunable, mode-hop-free lasers are now available. Table 1 lists three example widely tunable, mode-hop-free lasers that could not be used in the apparatus 120 of Mossberg without modifications to the apparatus to accommodate the large bandwidth. Table 1 includes model names, manufacturers, wavelength tuning range in nanometers (nm, 1 nm=10$^{-9}$ meters), sensitivity to acoustic perturbations based on mechanical components, tuning response speed in TeraHertz per second (THz, 1 THz=10$^{12}$ cycles per second), size in centimeters (cm, 1 cm=10$^{-2}$ meters), spectral linewidth in kiloHertz (kHz), 1 kHz=10$^3$ cycles per second) or MegaHertz (MHz, 1 MHz=10$^6$ cycles per second), approximate cost in United States dollars ($), and power consumption in Watts (W). The acronym MEMS for micro-electro-mechanical systems is also used in Table 1. These lasers offered access to the one or more actuators needed to actively control optical sweeps. These actuators are typically a low bandwidth motor control, a medium bandwidth piezo-electric actuator that controls the cavity length, and a high bandwidth laser injection current control.

TABLE 1

Example widely tunable, mode-hop-free lasers.

| Model | PICO-D ™ | PHOENIX 1000 ™ | unavailable |
|---|---|---|---|
| Manufacturer | Thorlabs | Luna Technologies | Advanced Semiconductor Lasers |
| Location | Newton, New Jersey | Blacksburg, Virginia | North Hollywood, California |
| Wavelength tuning range (nm) | >100 | >60 | >50 |
| Sensitivity to acoustic perturbations | Medium (large lever arm) | Better (MEMS-driven feedback reflector) | Best (MEMS direct contact reflector) |
| Tuning speed | ~5 THz/s | ~50 THz/s | ~1000 THz/s |
| Size | 25 cm × 4 cm × 7 cm | 3 cm × 2 cm × 1 cm | 0.5 cm × 0.5 cm × 0.5 cm |
| Spectral linewidth before stabilization | ~150 kHz | ~1 MHz | ~50 MHz |
| Cost | ~$22,000 | ~$15,000 | ~$5,000 |
| Power consumption | <20 Watts | <20 Watts | <20 Watts |

Figure 1D:
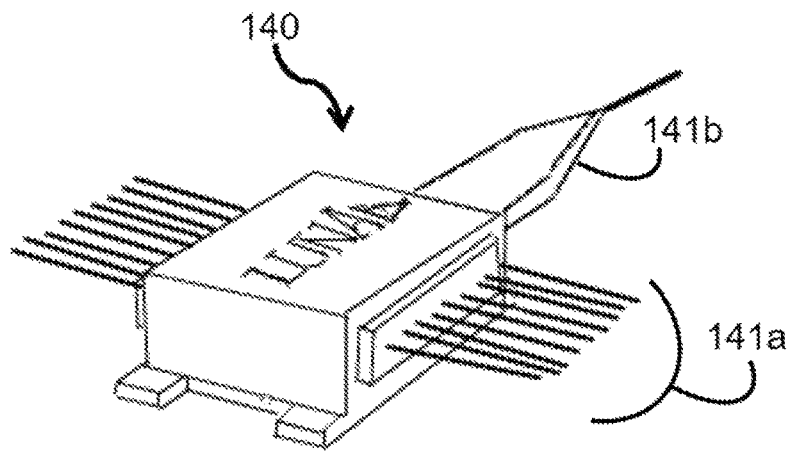
FIG. 1D and FIG. 1E are diagrams of a laser source, such as used in an apparatus to produce a precise broadband optical waveform, according to an embodiment.
Figure 1E:
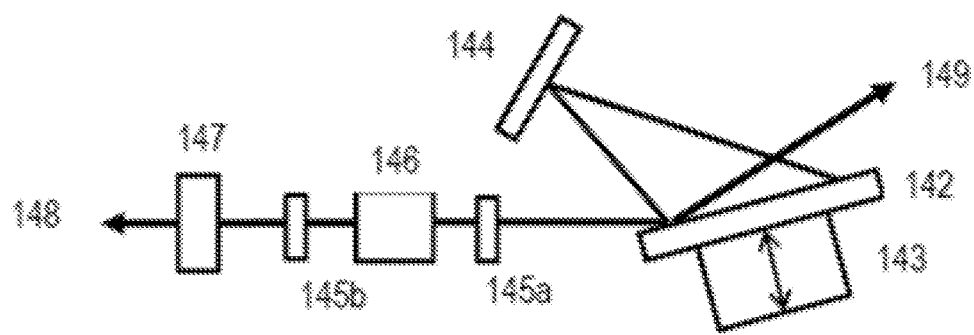

FIG. 1D and FIG. 1E are diagrams of a laser source, such as used in an apparatus to produce a FMCW, according to an embodiment. FIG. 1D depicts the PHOENIX 1000 laser 140 which includes multiple electronic control leads 141a and a fiber optic laser output 141b. The tunable components of laser 140 are depicted in FIG. 1D. where an optical beam formed by laser oscillation between feedback mirror 144 and left output of optical gain chip 146 is represented by a thick solid arrow, such as output beam 148 directed to fiber 141b and beam 149 directed to a monitor photodetector. The PHOENIX 1000 laser is an external cavity diode laser in Littman configuration. The laser 140 includes a diffraction grating 142 translated in the direction of the double arrow by a piezo-electric actuator 143, a feedback mirror 144 rotated by a MEMS actuator, lenses 145a and 145b (collectively referenced hereinafter as lenses 145), gain chip 146, and isolator 147.

Wavelength tuning is achieved by MEMS actuation of the feedback mirror 144, which can tune the full range at 10 Hz repetition rates. Fine tuning can be accomplished by translating the diffraction grating 142 with the piezoelectric actuator 143. The entire laser is confined to a fiber coupled butterfly package, as shown in FIG. 1D. The laser exhibits a linewidth of about 1 MHz, which is predicted to provide a range window limit greater than 100 m, even without linewidth narrowing resulting from the active feedback.

However, the inventors own work has shown that significant foreseen and unforeseen obstacles to applying these approaches arise when attempting to stabilize broadband frequency waveforms (greater than about 50 GHz) from the newly available, widely tunable, mode-hop-free lasers. 1] Even when the beat frequency is perfectly stabilized to a reference oscillator, the laser's optical frequency sweep is not linear due to dispersion differences between the two heterodyne paths. 2] The laser stabilization quality is degraded when non-polarization-maintaining and multi-mode optical fibers are used in the setup. 3] Errors in the stabilized waveform result from acoustic and thermal perturbations to the setup. 4] The laser stabilization cannot be achieved over the full optical frequency sweep range when the required large error signals drive either the loop filter electronics or the frequency/phase actuator out of its range for making frequency/phase corrections. 5] The stabilization quality is insufficient for some applications because systematic errors remain in the laser frequency sweep despite the active linearization (e.g., non-linear responses to a linear driving voltage cannot be perfectly modeled by analytical curves). 6] The stabilization lock is lost when the laser frequency is returned to its original nominal value for the start of the next repetitive sweep. 7] High bandwidth frequency and phase errors from the desired waveform persist because the feedback bandwidth of intracavity laser frequency actuators can be insufficient to achieve the desired stabilization. 8] The achievable optical frequency waveform repetition speed is limited to low values due to limited bandwidth of actuators and excitations of the optical frequency actuator mechanical resonances.

For example, the PHOENIX 1000 is subject to non-linear responses to linear driving voltages. Thus, to deliver a linear frequency output, a non-linear driving voltage must be input. FIG. 1F and FIG. 1G are graphs 150a, 150b, that illustrate an example analytical fit to a non-linear response of the laser source of FIG. 1D and FIG. 1E, according to an embodiment. In FIG. 1F, the horizontal axis 152a is voltage applied to one of the control leads of the PHOENIX 1000 that controls the counterclockwise rotation of the mirror 144. The vertical axis 154a is output wavelength (inversely proportional to optical frequency). Measured wavelengths are indicated by the dots 154a. A functional fit to the measurements (Y) for a given input (X) is given by the Equation 1a, plotted as curve 156a.

$$Y=0.0017712X^2+0.034539X+1541 \qquad (1a)$$

However, deviations from the functional fit of Equation 1a can still lead to important deviations from linearity over large bandwidths, B.

Similarly, in FIG. 1G, the horizontal axis 152b is voltage applied to another one of the control leads of the PHOENIX 1000 that controls the clockwise rotation of the mirror 144. The vertical axis 154b is output wavelength (inversely proportional to optical frequency). Measured wavelengths are indicated by the dots 154b. A functional fit to the measurements (Y) for a given input (X) is given by the Equation 1b, plotted as curve 156b.

$$Y=-0.00188721X^2-0.024075X+1541.9 \quad (1b)$$

However, deviations from the functional fit of Equation 1b can still lead to important deviations from linearity over large bandwidths, B. When following the manufacturer's recommendation to operate these two mirrors simultaneously, a more linear chirp is produced. Deviations from the more linear chirp can still lead to important deviations from linearity over large bandwidths, B.

An active feedback loop, as suggested by Mossberg, as well as corrected driving functions, suppress, but do not eliminate, errors in the optical frequency waveform. Residual errors are unavoidable for stochastic noise processes that produce random errors and for characteristics of various components that produce systematic errors. Systematic errors are those that are not random and are consistently present in a repeatable manner for each chirp. Systematic errors to the desired waveform can be measured. For example, the measured frequency error after several repeats of the waveform can be determined and treated as systematic errors.

FIG. 1H is a pair of graphs, 160a and 160b, that illustrate example systematic errors, according to an embodiment. The horizontal axis 162 is time in relative units, increasing to the right, and used in both graphs. The vertical axis 164a is optical frequency in relative units increasing upward; and the vertical axis 164b is the optical frequency deviation from linear in the same relative units. An idealized linear response is indicated by line 166. The average optical frequency output over many repeated waveforms is given by trace 168a. The average deviations from the ideal are plotted as trace 168b in graph 160b, with positive deviations above the axis 162 and negative deviations below the axis 162. The average deviations can be treated as systematic errors. Of course, the actual frequency error on each measurement would deviate from the average frequency error due to random fluctuations. The systematic errors indicated in graph 160b constitute an example of obstacle 5, enumerated above.

An often important cause of deviations from ideal frequency response over large bandwidth B is dispersion differences in the two or more optical paths over which heterodyne measurements are made. This problem is an example of obstacle 1, enumerated above. Dispersion errors arise because much of the various measurement systems utilize fiber technology for splitters, reference delays, and delivery. With dispersive delays, such as occurs in optical fibers like fiber delay 128, $\tau_D$ becomes a function of the instantaneous optical frequency (and therefore time) as the optical frequency changes in time. The mathematical development and description in Mossberg, and the culminating statement that "each value of $\Delta v_{AOM}$ corresponds to a specific time rate of change of laser frequency" do not hold true for dispersive delays. Therefore, the desired precision tuning described by Mossberg will not be achieved for dispersive delays and large bandwidths.

To understand the effect of dispersion on the linearity of the chirp and the heterodyne beat note and resulting ranges, the following theoretical considerations are offered. However, the embodiments and scope of the claims are not limited by the accuracy or completeness of these theoretical considerations.

In the presence of dispersion, the optical delay is a function of the optical frequency. The time domain effect of dispersion is calculated by transforming the time dependent field to the Fourier domain, multiplying by a quadratic phase factor, $\exp(i\beta_2\omega^2)$, where $\beta_2$ is the material dispersion coefficient, then transforming back to the time domain. For single mode fiber at optical wavelengths near 1550 nm, $\beta_2$ is about −23 picoseconds (ps, 1 ps=$10^{-12}$ seconds) squared per kilometer (km, 1 km=$10^3$ meters), i.e., about −23 ps$^2$/km. The main result is that a linear frequency chirp with an initial rate $\kappa_0$=dv/dt=$\alpha/2\pi$, after propagation through a medium of length z, emerges with a new chirp rate given by Equation 2a.

$$\alpha'=\alpha/(1+\alpha\beta_2z)\approx\alpha(1-\alpha\beta_2z) \quad (2a)$$

Therefore in the self-heterodyne setup of Mossberg, the interferometric beat note fbeat (=$\delta f$) will change with time t, as given by Equation 2b.

$$f\text{beat}\approx\frac{1}{2}\pi\alpha'\tau_D(1+\alpha\beta_2L_D/\tau_Dt). \quad (2b)$$

where $L_D$ is the physical length of the dispersive delay path, such as the length of the delay fiber.

Figure 1I:
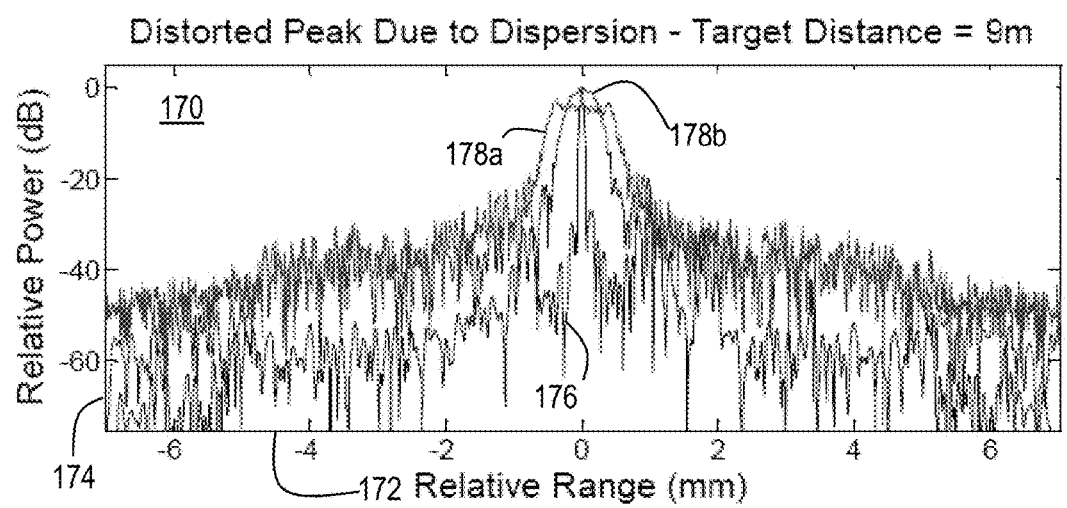
FIG. 1I and FIG. 1J are graphs that illustrate the effect of differential dispersion on a reference path, according to an embodiment.
Figure 1J:
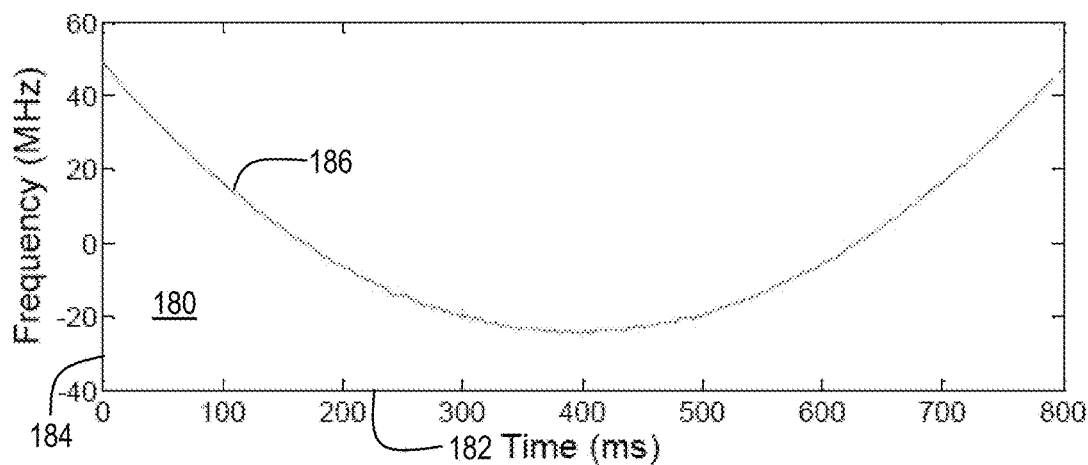

For small $\alpha$ and/or small bandwidth, B 105, neglecting material dispersion in the reference delay may not cause noticeable deviations from linearity. However, for large sweep bandwidths, B 105, the experimental data shown next highlights how systems with dispersive delays must be treated differently from the prior art prescriptions. FIGS. 1I and 1J are graphs 170 and 180 that illustrate the effect of differential dispersion on a reference path, according to an embodiment. In FIG. 1I, the horizontal axis is relative range in millimeters (mm, 1 mm=$10^{-3}$ meters); and the vertical axis is relative power in decibels (dB). Traces 176, 178a and 178b are Fourier transforms of photodetector signals of broadband chirps, to be compared to FIG. 1B. Trace 176 is based on using fiber in both optical paths to compensate for dispersion. Trace 178a is based on a fiber delay in one path and no dispersion in the second path, and performing the Fourier transform with a square window. FIG. 176b is the same experimental setup, with a Hanning window used before performing the Fourier transform. In FIG. 1J, the horizontal axis is time in milliseconds (ms, 1 ms=$10^{-3}$ seconds); and the vertical axis is optical frequency deviations from linearity in megahertz (MHz). Trace 186 shows the output of the stabilized beam with no compensation for dispersion.

For the data shown, fbeat was held constant using a feedback loop to cause a laser sweep over 5 THz. The data shows the deviations from linearity for the laser's frequency sweep. In contrast to system in the prior art, such as in Mossberg, the present system's optical frequency, trace 186, does not exhibit linear tuning in time. In fact, the deviations from linearity are almost as large the original laser tuning bandwidth (100 MHz) in Mossberg. These deviations are significant for many applications. For example, in ranging systems, as depicted in FIG. 1I, the dispersion leads to a broadening of the peak delay (range) seen in traces 178a and 178b compared to trace 176, leading to greater uncertainty in the determination of the delay or range.

Precise Broadband Optical Source Structural Overview

To ameliorate the effects of one or more of the obstacles enumerated above to achieving broadband precise optical frequency chirps, one or more components of the apparatus of Mossberg depicted in FIG. 1C are changed or additional components are added, alone or in some combination.

Figure 2:
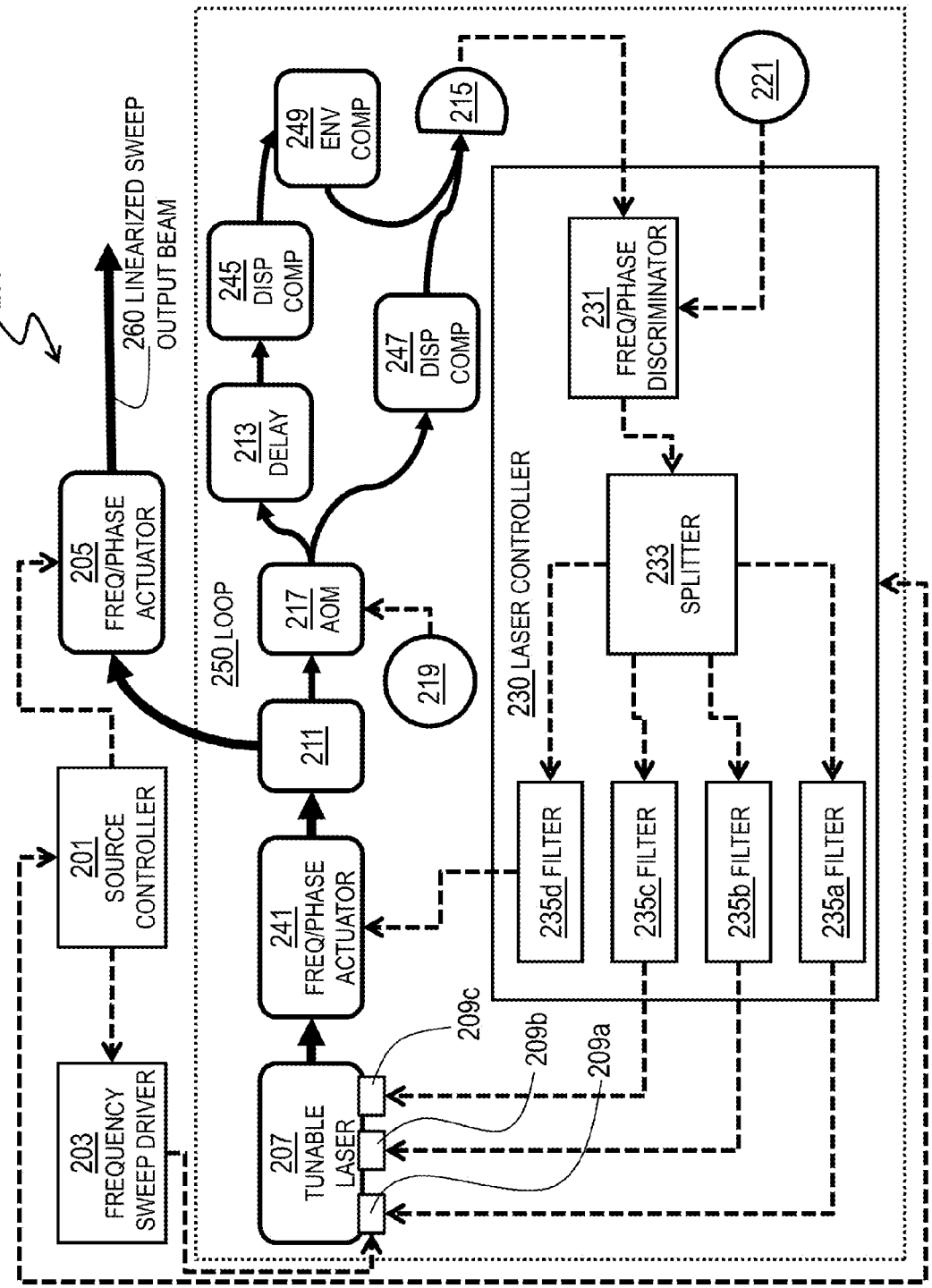
FIG. 2 is a diagram of a broadband frequency modulated laser source, according to one embodiment.

FIG. 2 is a diagram of a broadband frequency modulated laser source 200, according to one embodiment. The source 200 is capable of producing highly linearized optical chirps, or other highly precise waveforms, over a large bandwidth in excess of 50 GHz. The source 200 includes a source controller 201, a frequency sweep driver 203, an output frequency/phase actuator 205 (also called an output actuator 205, for convenience), and a feedback loop 250 that includes a tunable laser 207. Optical beams are represented in FIG. 2 as solid arrows pointing in a direction of propagation. Electrical signals are represented as dashed arrows pointing in a direction of signal propagation and may be carried by wired or wireless channels in series or parallel.

The source controller 201 provides control signals for various components of the source 200, such as the frequency sweep driver 203, output actuator 205 and a laser controller 230, described in more detail below. In some embodiments, the source controller 201 also receives data from the laser controller 230, e.g., data indicating measurements made of deviations from linearity of other desired waveform, as indicated by the two-way arrowheads. In some embodiments, source controller 201 also sends out signals that depend on dispersion differences in the two optical paths or measured environmental conditions or residual systematic errors predetermined for laser source 200. In some embodiments, the source controller 201 is a separate computer; in some embodiments the source controller is a built-in computer or chip set or processor.

The frequency sweep driver 203 provides a sweep signal (such as a RF electronic signal) that causes the tunable laser 207 to change the tunable laser's optical frequency over the desired bandwidth (e.g., >50 GHz) for the output waveform (e.g., linearized sweep output beam 260) produced by the source 200. Any method known in the art may be used to generate the sweep signal. Any type of signal may be used, including a voltage or a current, which is appropriate for driving a particular tunable laser 207. Example commercially-available tunable lasers and the corresponding driver signals are described above in Table 1. In some embodiments, the controller 201 or frequency sweep drive is configured to introduce small deviations from an output waveform (e.g., a linear sweep) to correct for predetermined systematic errors in the output of the source, as described in more detail below with respect to passive error correction to overcome obstacle 5, enumerated above. In some embodiments, the controller 201 or frequency sweep driver 203 is configured to generate a series of alternating increasing and decreasing signals, which cause the laser's optical frequency to increase and decrease, respectively (or vice versa) over the desired bandwidth, as described in more detail below to overcome obstacle 6 enumerated above.

The output actuator 205 is an optical device, or combination of devices, such as an acousto-optic modulator (AOM) or electro-optic modulator (EOM), widely known in the art, which changes the frequency or phase of an optical waveform. The effect is controllable based on an input signal from the source controller 201. In various embodiments, the output actuator 205 modulates the frequency or phase, or both, of an output beam in response to any imperfections, such as non-linear response of the laser 207 to the frequency sweep driver 203, environmental perturbations to the laser 207, uncorrected dispersion differences among multiple optical paths in the feedback loop 250, environmentally caused changes to the delay in one or more optical paths in the feedback loop 250, or other systematic errors in the beam leaving the feedback loop 250, alone or in some combination. The modulations imposed by output actuator 205 are among the "out-of-loop" corrections to overcome obstacle 5 and or 7, enumerated above. In some embodiments, sufficient correction is applied within the driver 203 or feedback loop 250 or both; and, output actuator 205 is omitted.

The feedback loop 250 includes optical components and electrical components. The feedback loop electrical components include laser controller 230, AOM RF source 219 and phase locked loop (PLL) RF source 221, described in more detail below. Optical detectors that output electrical signals and lasers with electrical controls are considered optical components for the purposes of this description.

The feedback loop optical components include the tunable laser 207, one or more in-loop frequency/phase actuators 241 (also called an in-loop actuator 241), a beam splitter 211, an AOM 217, an optical detector 215 (also called a photodetector, or simply a detector), and two optical paths between the AOM 217 and the detector 215. One optical path, called a delayed path, includes an optical delay component 213. In the illustrated embodiment, the delayed path includes a dispersion compensation component 245 and an environmental compensation component 249. The other optical path includes dispersion compensation component 247. In some embodiments, one or more of dispersion compensation components 245, 247 and environmental compensation component 249 and in-loop actuator 241 are omitted. In some embodiments, additional optical paths between AOM 217 and detector 215 are included. In some embodiments other or different optical components, such as a polarizer or fiber isolator, are included in one or more optical paths. For example, another beam splitter, either separate from or integrated with beam splitter 211 is used with or in place of AOM 217 in some embodiments.

The tunable laser 207 outputs a frequency-varying optical waveform based on signals input to one or more drive inputs. In the illustrated embodiment, the tunable laser 207 includes three drive inputs 209a, 209b, and 209c. The signal received at drive input 209a from the frequency sweep driver 203 is used to vary an internal actuator of the tunable laser to output a laser beam that varies over the entire frequency bandwidth of interest. Direct individual control of one or more additional internal actuators is represented by the additional drive input 209b and drive input 209c. For example, as described above, the PHOENIX 1000 has an internal MEMS motor that moves a mirror to define the laser cavity, piezoelectric component that deflects a diffraction grating, and a laser injection current supply that can be driven separately, using drive input 209a, drive input 209b, and drive input 209c, respectively. As described below, the response times of these various internal components differ; e.g., the motor is slowest to respond and the current is fastest to respond. The frequency range over which an actuator responds linearly is typically referred to as its "response bandwidth". For the PHOENIX 1000, the MEMs motor that rotates the minor 144 has the lowest bandwidth (about 400 Hz, slow), the piezo-electric actuator 143 has the next highest bandwidth (about 10 kHz, medium), and the current has the highest bandwidth (about 500 kHz, fast). This means that if there is some error needing correction at 100 kHz frequency, the current has to be used to suppress that error. The actuation range refers to the optical frequencies over which an actuator has control. For instance, the MEMS mirror 144 can tune over about 6 THz (very broad), the piezo-electric actuator 143 is possibly able to tune the laser's frequency over 50 GHz (fairly broad), and the current can tune the laser's frequency over about 2 GHz (not so broad).

Therefore, if some noise source is causing a very large deviation from desired frequency modulation (say 200 GHz), the mirror 144 motor has to be used to correct it. Typically, the larger deviations are slower, so this works out well. Within the response bandwidth, a particular frequency might be most effective, often associated with a resonant frequency for a mechanical portion of the internal actuator, if any. In general, a drive signal at the resonant frequency of the internal actuator produces a large output optical change within the actuation range for a relatively small input signal change.

The in-loop actuator 241 is included in some embodiments to modulate the optical waveform output by the tunable laser 207 at actuation ranges or response bandwidths beyond those available for the internal actuators, e.g., at drive inputs 209*a*, 20*b*, 209*c*. Such modulation is described in more detail below. In some embodiments, in-loop actuator 241 is omitted.

Beam splitter 211 directs a portion of an incident beam to the output of the laser source 200, such as to output actuator 205, to be used as the linearized sweep (or other waveform) output beam 260. In some embodiments, the beam splitter 211 is a 90/10 splitter, with 90% of the incident beam directed to the output. The remainder of the beam is directed to an optical detector 215 through two or more optical paths for heterodyne detection of deviations from desired modulation.

The optical detector 215 outputs an electrical signal in response to the combined optical waves incident on the detector's optically active face. In particular, as a result of the heterodyne combination of waves traversing two optical paths, the signal output by the detector produces a beat frequency $f$beat dependent on the difference between the frequencies of the optical waves arriving at the detector via the two different optical paths.

In the illustrated embodiment, the remainder of the beam output from beam splitter 211 is directed to an AOM which splits the beam and introduces a frequency and phase shift away from noisy low electrical (e.g., radio) frequencies. Beam splitter 211, AOM 217 and detector 215 are known and used in prior art approaches, e.g., in the apparatus 120 of Mossberg. AOM RF source 219 drives the AOM 217 with a particular RF signal that is converted to an acoustic signal that causes the desired shift in optical frequency of the optical wave.

Delay component 213, such as a length of coiled fiber cable, introduces a travel time delay along one of the optical paths called the delayed path relative to the other path(s). When a delay is introduced into a frequency varying waveform, it arrives at a detector simultaneously with a non-delayed waveform having a potentially different frequency. While delay components are known in heterodyne detection (e.g., fiber delay 128 in the apparatus 120 of Mossberg), in some embodiments delay component 213 includes additional features. For example, in some embodiments, delay component 213 includes a single-mode optical fiber that maintains a single inserted polarization throughout its length and a polarizer (a polarization filter) to polarize the beam to match the fiber's properties before insertion, as described below to overcome obstacle 2, enumerated above. In some embodiments, delay component 213 includes a single mode optical fiber that is insensitive to inserted polarization.

In some embodiments, either or both optical paths include a dispersion compensation component, such as dispersion compensation components 245 and 247 depicted in FIG. 2. Dispersion causes different frequencies traversing the same optical delay element, e.g., same optical fiber, to travel at different speeds and thus experience different delays. If the non-delayed path does not travel through fiber at all, or travels through a shorter length of fiber than the delayed path, then the non-delayed wave travel time will not change with frequency, or not as much as for the delayed wave's, respectively. As a result, the frequency difference of the heterodyne combined wave changes with frequency, and hence changes with time for a perfectly linear chirped waveform emitted from the tunable laser 207. The purpose of the dispersion compensation component(s) is to decrease the difference in dispersion between the two paths. Various approaches to dispersion compensating components are described below, for the delayed path and non-delayed path, respectively, to overcome obstacle 1, enumerated above.

In some embodiments, the time varying frequency difference is compensated by causing AOM RF source 219 to provide a compensating time varying RF signal, as described in more detail below.

The environmental compensation component 249 is included in some embodiments to correct for environmental effects on delay component 213, such as temperature and acoustic pressure on the length of or speed in an optical fiber, to overcome obstacle 3, enumerated above. Some approaches are described below for stabilizing the fiber length.

The electrical output signal from detector 215, i.e., the detector signal, is input to the laser controller 230. The RF beat of the heterodyne combination is fully captured in this detector signal including phase, frequency, and amplitude. Deviations from a desired beat associated with perfect linearization (or other desired waveform) are determined by comparing the detector signal to a reference signal for the desired beat frequency and phase. The phase locked loop (PLL) RF source 221 provides the reference signal. Without dispersion or with effectively compensated dispersion in the optical components, the desired beat frequency and phase is a constant for a perfectly linear chirped waveform. However, with remaining dispersion, the desired beat frequency and/or phase would be time varying. Thus, in some embodiments, a time varying frequency reference is provided by causing PLL RF source 221 to provide a time varying RF signal, as described in more detail below. The same effect can be achieved using a time-varying AOM RF source 219 instead of, or in combination with, the time varying PLL RF source 221.

The laser controller 230 includes a frequency/phase discriminator 231, a signal splitter 233, and one or more filters, e.g., filter 235*a*, filter 235*b*, filter 235*c* and filter 235*d*, collectively referenced hereinafter as filters 235. These filters may include frequency dependent amplification. The frequency/phase discriminator 231 determines a frequency or phase difference between the detector signal and the reference signals produced by the PPL RF source 221. Any phase or frequency differences between detector signal and the reference signal indicate errors from the desired time rate of change of the optical frequency of the tunable laser 207. The splitter replicates this error signal, or portions thereof, as separate signals that are each directed to one of the filters 235. Each filter passes the portion of the error signal within the response bandwidth of one of the tunable laser's 207 internal actuators (or external in-loop actuator 241) and feeds that portion of the error signal to the corresponding drive input 209 (or external actuator 241), as described in more detail below. In the illustrated embodiment, filtered signal output from filter 235*a* is input to drive input 209*a*. Similarly, filtered signal outputs from filters 235*b*, 235*c*, 235*d* are input to drive inputs 209*b*, 209*c* and in-loop actuator 241, respectively. In some embodiments, the maximum amplitude output from the filter is limited to account for an actuator's limited actuation range, to avoid damage to laser components or in-loop actuators. In some embodiments the filter outputs are adjusted further to correct for at least some predetermined systematic errors, as described in more detail below.

Precision LADAR Structural Overview

Figure 3:
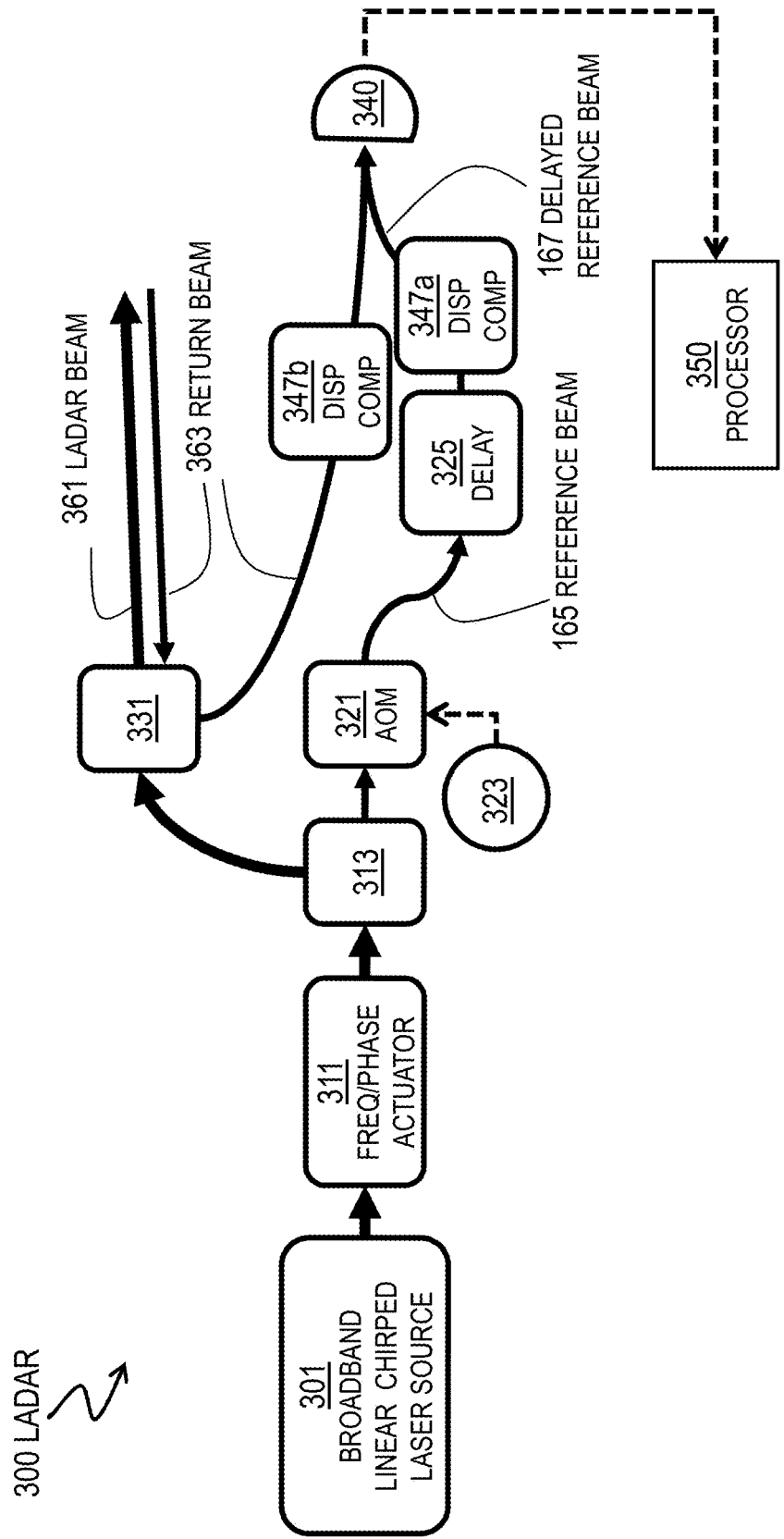
FIG. 3 is a diagram of components of a laser detection and ranging (LADAR) system, according to one embodiment.

FIG. 3 is a diagram of components of laser detection and ranging (LADAR) system 300, according to one embodiment. The LADAR system 300 includes a broadband linearized chirped laser source 301 (such as broadband linear chirped laser source 200), a frequency/phase actuator 311, a beamsplitter 313, an optical detector 340, a processor 350, and two optical paths between beamsplitter 313 and detector 340. The first optical path is a reference optical path that passes through AOM 321 driven by AOM RF source 323, and passes through a reference delay 325. In some embodiments, the first optical path also passes through a dispersion compensation component 347a. The second optical path is an optical path that passes through a telescope or beamsplitter 331 to a target as LADAR beam 361, reflected back from target as return beam 363, and directed to detector 340. In some embodiments, the second optical path passes through a dispersion compensation component 347b. The target may be any hard or soft target including a cloud or gas. Heterodyne combination at detector 340 is able to determine the difference in delay between the reference optical path and the target optical path. The processor 350, such as a general purpose computer, determines the delay difference based on the beat frequency in the detector signal, e.g., by performing Fourier analysis with a digital signal processing (DSP) chip, well known in the art. Other arrangements of components for ranging are described below, such as for several experimental embodiments.

In some embodiments, dispersion errors or other contributions to systematic errors are corrected by the processor 350 based on algorithms appropriate to the ranging application. The measured effects of dispersion and other systematic errors for ranging are described above with reference to FIG. 1H, FIG. 1I and FIG. 1J. In other applications, the same or different algorithms to correct for dispersion differences or other systematic errors are employed.

Although a particular set of optical components, electrical components, beams, signals and processes are shown in FIG. 2 and FIG. 3 for purposes of illustration, in various other embodiments more or fewer optical components, electrical components, beams, signals and processes are involved. Furthermore, components and beams are depicted as particular blocks in a particular arrangement for purposes of illustration, in other embodiments each component or beam, or portions thereof, may be separated or combined or arranged in some other fashion.

Precise Broadband Optical Source Functional Overview

Figure 4:
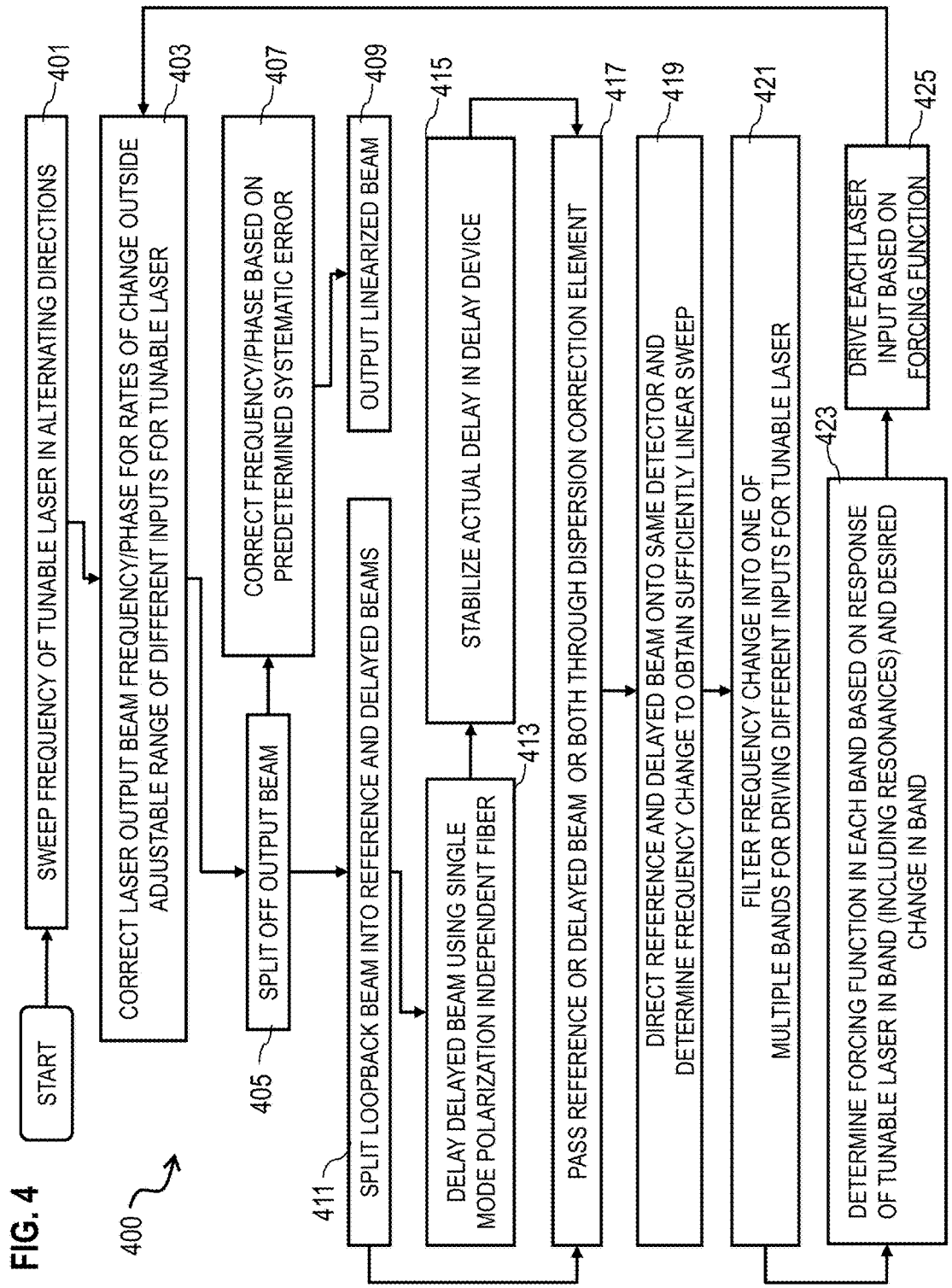
FIG. 4 is a flowchart of a process to generate a broadband precise frequency modulated optical beam, according to one embodiment.

FIG. 4 is a flowchart of a process 400 to generate a broadband precise frequency modulated optical beam, according to one embodiment. Although steps in FIG. 4 and subsequent flow chart FIG. 4 are shown in a particular order for purposes of illustration, in other embodiments, one or more steps may be performed in a different order or overlapping in time, in series or in parallel, or one or more steps may be omitted or added, or changed in some combination of ways.

In step 401, the optical frequency output by a tunable laser is swept through the bandwidth of interest in alternating directions, e.g., increasing optical frequency followed by decreasing optical frequency. For example, source controller 201 causes the frequency sweep driver 203 to input a sweep signal to motor drive input 209a to cause the optical frequency of the tunable laser to change smoothly, first in one direction (e.g., increasing frequency) and then in the opposite direction (e.g., decreasing frequency). Step 401 corresponds to generating a beam of a laser comprising a series of alternating increasing and decreasing frequency modulated waveforms, e.g., chirps, of a desired large bandwidth.

In step 403, the systematic errors in the frequency or phase or both of the laser output beam is corrected. Step 403 includes determining the errors in the sweep linearity by any means desired, such as based on previously collected measurements of sweep linearity, e.g., using the recently developed methods described in: Tae-Jung Ahn and Dug Young Kim, "Analysis of nonlinear frequency sweep in high-speed tunable laser sources using a self-homodyne measurement and Hilbert transformation," Appl. Opt. 46, 2394-2400. In some embodiments, the measured errors are averaged over many iterations to determine the systematic errors versus random errors.

In some embodiments, during step 403, the in-loop actuator 241 modulates the laser beam based on input from filter 235d to correct for the measured errors. Thus, one or more of multiple filtered signals is employed as loopback to one or more of the actuators to generate a more stable rate of change of the frequency of the beam of the laser. In some embodiments, this step also accomplishes modifying the beam of the laser based on an otherwise uncorrected difference in dispersion between the different optical paths.

In step 405, the output beam is split off, such as in beam splitter 211. In step 407 the output beam frequency or phase or both are modulated to correct for one or more predetermined systematic errors, such as residual nonlinear response of the laser frequency to the frequency sweep driver, e.g. using frequency/phase actuator 205. In some embodiments, other steps provide sufficient correction and step 407 is omitted. In step 409, a highly linearized beam (or other precise waveform) over a broad frequency band greater than 50 GHz is output.

In step 411, the residual beam not split off as output, called the loopback beam herein, is split into a reference beam and delayed beam to traverse the reference optical path and the delayed optical path, respectively. Thus, the laser beam is split into first and second beam portions which traverse different optical paths with different travel times for a same optical frequency.

In step 413 the delayed beam is delayed using a single mode polarization independent fiber. In other embodiments, the delayed beam is delayed using other means, such as a free space path with adjustable mirror to trap and then release the beam; or using fibers that are single mode for single polarization with a polarizing filter, e.g., in delay component 213. In step 415 the actual delay in the delay device is stabilized, e.g., using the environmental compensation component 249. In some embodiments, step 415 is omitted.

In step 417 either the reference beam or the delayed beam is, or both are, passed through a dispersion compensation component. Thus, at least one of the first and second beam portions passes through an optical component to compensate for differences in frequency dispersion between the different optical paths that would otherwise result. In some embodiments that perform dispersion correction external to the loop or with algorithms, step 417 is omitted.

In step 419, both the reference and delayed beams are directed onto the same detector; and the modifications to the optical frequency necessary to obtain sufficient linear optical sweep is determined Thus, the first and second beam portions are combined after the first and second beam portions have traversed the different optical paths. The combined beam has a time varying intensity that is a function of the time rate of change of the frequency of the laser and the delay between the two optical paths.

In step 421 the error signal is filtered into one of multiple actuation bands for driving different inputs for the tunable laser. For example, the error signal from the frequency phase discriminator 231 is filtered by filters 235 into correction signals for different actuator ranges. Thus, a signal is derived from the time varying intensity, which is a function of the time rate of change of the frequency of the beam of the laser. The derived signal is filtered into a plurality of filtered signals in a corresponding plurality of response bandwidths and actuation ranges for a corresponding plurality of actuators that affect an optical frequency of the beam of the laser.

In step 423, a forcing function is determined in each response bandwidth and actuator range based on the response of the tunable laser in the band, including any resonances, and the desired change in the band. Thus, multiple filtered signals are determined for loopback to the plurality of actuators to stabilize the rate of change of the frequency of the beam of the laser.

In step 425, each laser input is driven based on the corresponding forcing function. Thus, multiple filtered signals are employed as loopback to the plurality of actuators to stabilize the rate of change of the frequency of the beam of the laser.

In some embodiments, the entire frequency change is used to force a single actuator; and steps 421 and 423 are omitted, while a forcing function signal derived from the error signal determined in step 419 is employed as the loopback signal to stabilize the rate of change of the optical frequency of the beam of the laser.

Precision LADAR Functional Overview

Figure 5:
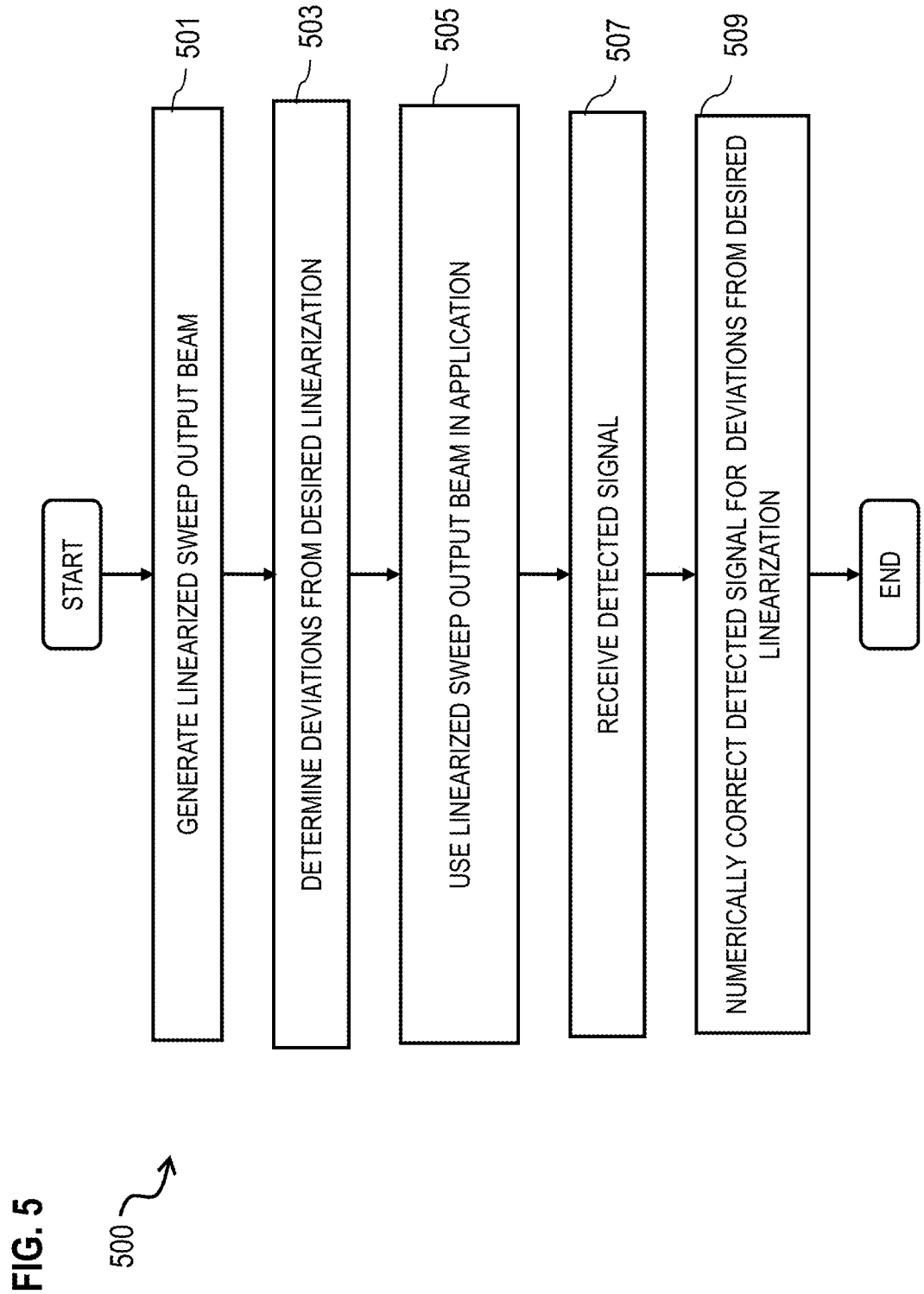
FIG. 5 is a flowchart of a process to use a broadband optical chirp in an application requiring a highly linearized chirp, according to one embodiment.

FIG. 5 is a flowchart of a process 500 to use a broadband optical chirp in an application requiring a highly linearized chirp, according to one embodiment. In step 501 a linearized sweep output beam is generated, e.g., from one or more steps of method 400, such as using laser source 200. Although ranging is shown utilizing a linear chirp, in other embodiments, ranging is done using any modulated waveform.

In step 503 deviations from desired linearization are determined In some embodiments, the deviations from linearization are measured during step 503. In some embodiments, predetermined deviations are received. Any method may be used to receive this data. For example, in various embodiments, the data is included as a default value in software instructions, is received as manual input from a network administrator on the local or a remote node, is retrieved from a local file or database, or is sent from a different node on the network, either in response to a query or unsolicited, or the data is received using some combination of these methods.

In step 505, the linearized sweep output beam is used in an application, such as for ranging using the system 300. In step 507, a detected signal is received, e.g., in processor 350 from detector 340.

In step 509 the received signal is numerically or algorithmically corrected for deviations from desired linearization, for example using a chip set or a general purpose computer and stored instructions as processor 350.

Experimental Embodiments

Figure 6A:
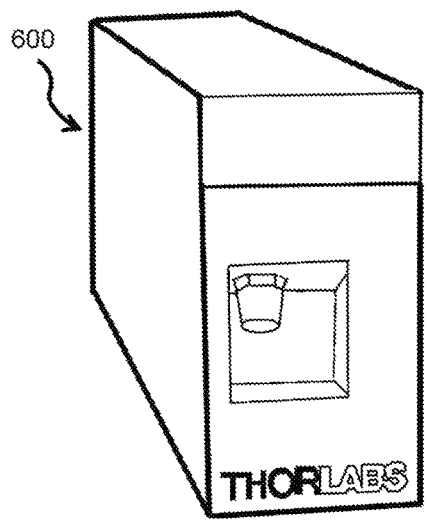
FIG. 6A and FIG. 6B are diagrams of an example laser source, such as used in an apparatus to produce a precise broadband optical waveform, according to another embodiment.
Figure 6B:
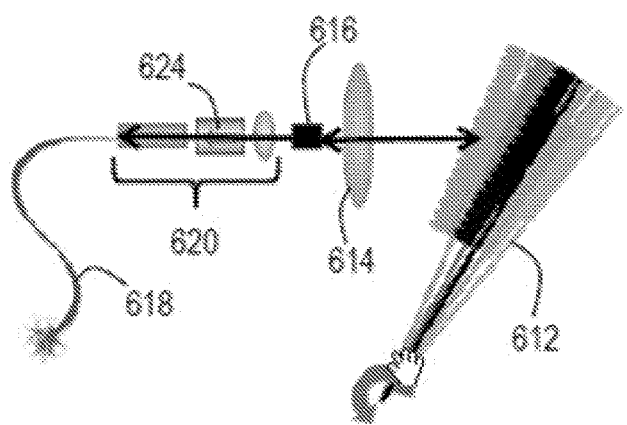

In some experimental embodiments, the PHOENIX 1000 laser was used, as described in Table 1 and FIG. 1D, FIG. 1E, FIG. 1F and FIG. 1G. In other experimental embodiments, the PICO-D laser was used. FIG. 6A and FIG. 6B are diagrams of this example laser source, which can be used as an apparatus to produce a precise broadband optical waveform, according to another embodiment. FIG. 6A depicts the external look of the PICO-D laser 600. As indicated in Table 1, this laser offered the best performance available in terms of wavelength tuning and linewidth. FIG. 6B illustrates example internal components including a rotatable diffraction grating 612 to adjust the cavity size and resulting optical wavelength, a lens 614, a laser diode 616, fiber coupling optics 620 including an optical isolator 624, and an optical fiber 618 carrying the output waveform. Like the PHOENIX 1000, the PICO-D laser offers the following actuators: a low bandwidth MEMS motor control; a medium bandwidth piezo-electric actuator that controls the cavity length; and a high bandwidth current control.

Figure 6C:
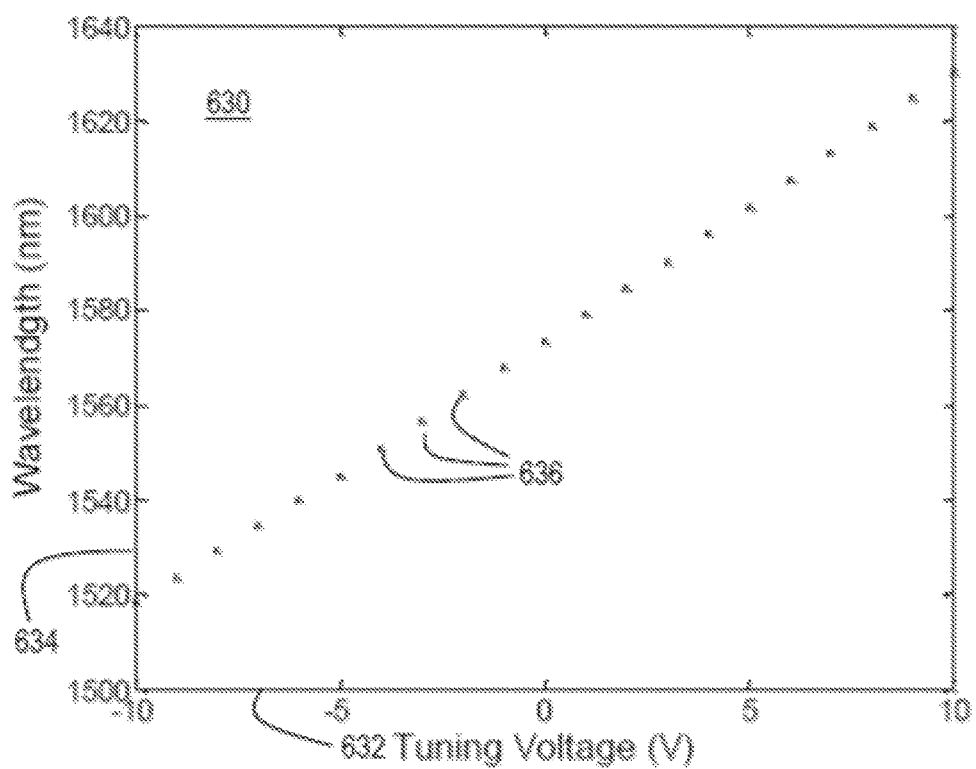
FIG. 6C is a graph that illustrates an example response of the laser source of FIG. 6A and FIG. 6B, according to an embodiment.

FIG. 6C is a graph 630 that illustrates an example response of the laser source of FIG. 6A and FIG. 6B, according to an embodiment. The horizontal axis 632 is motor tuning voltage in Volts (V), and the vertical axis 634 is the corresponding laser output wavelength in nanometers (nm). The observed output beams at each of several measured voltages are indicated by data points 636. As can be seen, the tuning is approximately linear with drive voltage. The slope of the linear fit is 5.6 nm/Volt.

Passive Compensation

To overcome obstacle 5 concerning systematic errors, one or more components are operated to compensate for known system errors. For example, when a distributed feedback (DFB) laser is tuned over large bandwidths using, significant nonlinearities are evident in the sweep. Or, for the PHOENIX 1000, such nonlinearities can be observed when tuning the MEMS motor, as seen in FIG. 1F and FIG. 1G. To minimize this laser's frequency deviations from linearity throughout the sweep, it is useful to apply a passive linearization procedure, before or after active linearization. Once the optimal temporal form for the voltage waveform that minimizes the deviations from linearity is determined, that form is used to drive the laser. Subsequently, active feedback to the laser's current is then summed in, as described in more detail below.

For example, the inverse of Equations 1a and 1b (solving for X as a function of Y) are determined A linear equation for Y as a function of time in substituted for the Y variable and a resulting equation is obtained for X as a function of time. A driving voltage with this non linear function of time produces a near linear optical wavelength (and thus near linear optical frequency) output. The result is a passive correction to deviations from ideal waveform.

Figure 7A:
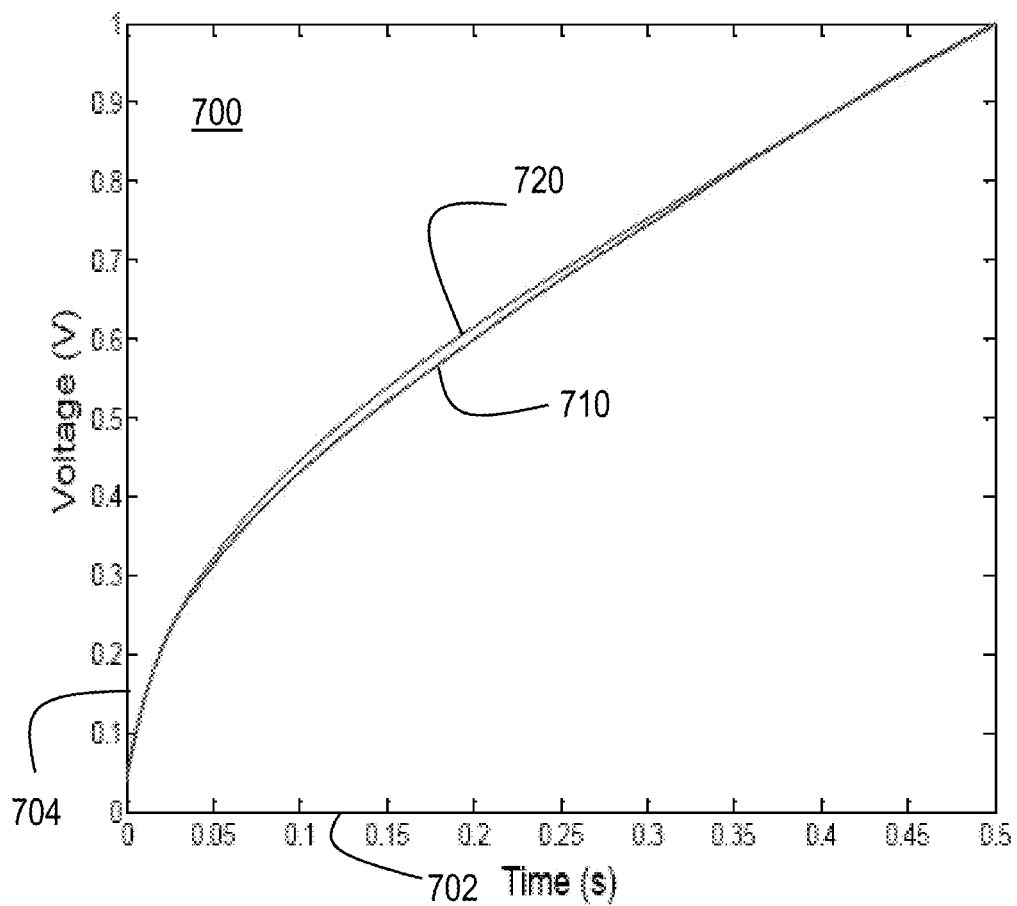
FIG. 7A is a graph that illustrates example driving voltages that compensate for non-linear response of the laser source of FIG. 1D, according to various embodiments.

Thus, a linearly interpolated drive voltage was derived for the CCW actuator using the data in FIG. 1F. This voltage was applied by frequency sweep driver 203 controlled by source controller 201; and the instantaneous frequency measured. From this data, a new drive voltage was interpolated to passively compensate for as much of the remaining nonlinearities as possible. This new drive voltage was applied by frequency sweep driver 203 controlled by source controller 201. The instantaneous frequency was again measured to assess how well the system performed. FIG. 7A is a graph that illustrates example driving voltages that compensate for non-linear response of the laser source of FIG. 1D, according to various embodiments. The horizontal axis 702 is time in seconds (s); the vertical axis 704 is voltage (V). The curve 710 is a first order input voltage to produce a frequency output that is near linear in time. The curve 720 is a second order input voltage to produce a frequency output that is more nearly linear in time.

Figure 7B:
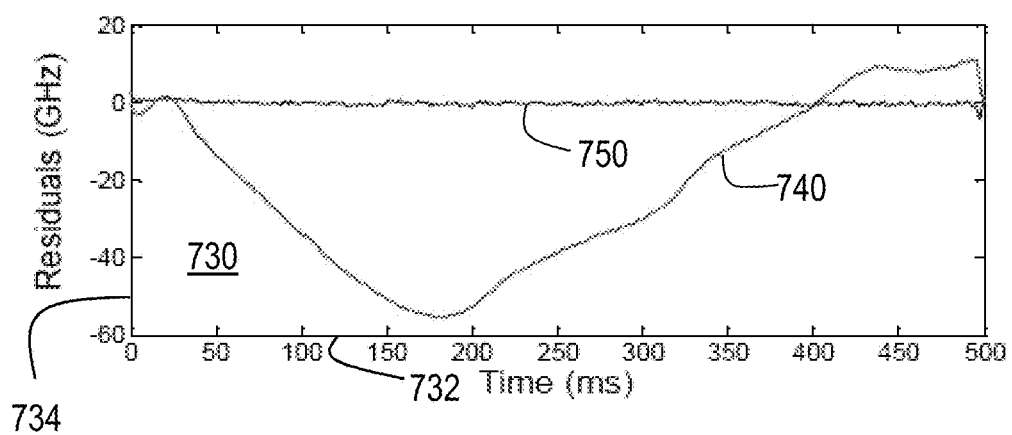
FIG. 7B is a graph that illustrates example deviations from ideal chirp output, according to various embodiments.

FIG. 7B is a graph that illustrates example deviations from ideal FMCW output, according to various embodiments. These are measurements of the output beam 260 without active feedback using the components of loop 250. These embodiments employ the PHOENIX 1000 laser 140 as tunable laser 207. The horizontal axis 732 is time in milliseconds (ms) and corresponds to axis 702. The vertical axis 732 is residual (deviation) in gigahertz (GHz) from a linear frequency output. Trace 740 shows the deviations for driving voltage trace 710. Trace 750 shows the deviations for driving voltage trace 720. After this type of passive compensation, the system error measured less than 0.5 GHz deviations from linearity. Such remaining deviations are well within the capabilities of the piezo-electric actuator 143 to compensate when active feedback is employed. Note that during these sweeps, the piezo-electric actuator 143 was driven with its appropriate quadratic ramp to eliminate cavity mode-hops.

Such passive corrections are not sufficient for some applications, such as some LADAR applications. FIG. 8A is a graph 800 that illustrates example deviations from an ideal chirp output for passively compensated systematic errors, according to an embodiment. The horizontal axis 802 is time in milliseconds (ms). The vertical axis 804 is frequency deviation in gigahertz (GHz). After the type of passive compensation described above, applied by frequency sweep driver 203 controlled by source controller 201, the measured residual deviation from linearity is about 0.15 GHz.

FIG. 8B is a graph that illustrates an example effect of passively compensating for systematic errors, according to an embodiment. The horizontal axis 822 is frequency in megahertz (MHz). The vertical axis 824 is relative power in deciBels (dB). The lighter trace 830 is the Fourier transform of the detected heterodyne signal (e.g., at detector 215) resulting from the uncompensated laser output. In comparison, FIG. 1B represents the ideal signal. The darker trace 840 is the Fourier transform of the detected heterodyne signal resulting from the passively linearized laser output (deviations from linearity shown by trace 810). The active feedback from laser controller 230 is omitted (and dispersion compensation components 245 and 247 are also omitted). As can be seen, the sweeps still have substantial nonlinearities that cause the system to not be Fourier transform limited. Note that the small noise spike in trace 840 is about the expected width for a Fourier transform limited system. Thus although passive compensation reduces errors, passive compensation of such laser sources cannot provide Fourier transform limited delay (and range) resolutions.

In other embodiments, one or more other systematic errors, such as those indicated in FIG. 1H are corrected by passive compensation. As indicated above, errors to the desired waveform can be measured and the needed electronic corrections can be added to the appropriate frequency actuator according to the time scales of the errors. This process is referred to as passive error correction because no automated feedback loop is present. Due to complexities in the behavior of the optical frequency actuator, iterative or learning algorithms are often useful to achieve the greatest suppression of systematic errors using passive error correction. One desires to achieve the greatest suppression of systematic errors using this technique. To obtain an accurate measurement of the original systematic errors, averages over multiple optical waveform errors can be taken. This reduces the stochastic error components in the averaged waveform. The passive error correction process can be applied before or after the active feedback loop 250 has been engaged, by applying passive corrections from laser controller 230 independent of those deduced from differences between the output from detector 215 and PLL generator 221. When applied after the active feedback loop has been engaged, the systematic error corrections for each actuator should be measured and the appropriate feedback applied directly before that actuator (after filtering and amplification electronics of the servo). In fact, it is possible to measure the error signal directly out of the servo, average this signal over many successive sweeps, and then sum this signal with the output of the error signal, but with opposite phase.

One embodiment of this uses the measured frequency error after several repeats of the waveform to create a corrective signal that is added to one of the frequency actuators. FIG. 1H shows an example average systematic frequency deviation from the desired waveform, in this case a linear chirp. The average frequency error due to these systematic errors in the stabilization system is shown in graph 160b. The actual frequency error on each measurement would deviate from the average frequency error due to random fluctuations, which cannot be eliminated by this process (though by removing the systematic errors, the stabilization system may be better conditioned to reduce random stabilization errors). In order to suppress the systematic errors that are not removed directly by the heterodyne detection of deviations in the active feedback loop, the frequency error versus time of several repeated waveforms is measured and averaged to find the average frequency error versus time. This error is then reproduced electronically, scaled in amplitude, and added directly to the electronic feedback to one of the frequency actuators 209 in order to cancel the systematic errors. If the systematic errors cannot be removed directly due to non-linear responses or non-flat frequency response of the actuator 209 to which the average frequency error is applied, the average frequency error can be pre-processed (digitally or analog) prior to being reproduced. The pre-processing should take into account the non-linearities or non-flat frequency response, so that the reproduced signal has the proper feed-forward response and spectral conditioning. The processed signal that is fed to a frequency actuator 209 anticipates the actuator's response to the systematic errors and provides the proper correction to best cancel out the systematic errors.

In some embodiments, one or more of the systematic errors are corrected in one or more of frequency/phase actuator 241 or external frequency/phase actuator 205, driven by either the laser controller 230 or the source controller 201 or some combination.

Active Compensation—Smooth Transition between Wavefronts

Obstacle 6, enumerated above, indicates that stabilization lock is lost when the laser frequency is returned to its original or nominal value for the start of the next repetitive sweep. For example, for repetitive optical frequency waveforms, the optical frequency must be returned to its nominal starting value. However, the start and end of the optical frequency waveform often differ greatly in optical frequency. In this case, if the laser's frequency is very rapidly returned to its starting position, then resonances in the mechanical tuning mechanism can easily be excited, which causes degradation or loss of the stabilization in the subsequent optical frequency waveform.

To address this obstacle, in some embodiments, alternating cycles reverse the direction of the frequency sweep. In some embodiments, such reversals are implemented in the frequency sweep driver 203 controlled by source controller 201. For many applications, such as FMCW LADAR, this time reversed waveform can be used to acquire data just as effectively as the time forward waveform. To produce the smallest errors, it is desirable to ensure that the optical frequency waveform slope slowly reaches zero (relative to the actuator resonance frequency) at the transition points between the time-forward and time-reversed waveforms. This can enable the stabilization to be retained for all times throughout a repetitive optical frequency waveform.

FIG. 9A through FIG. 9E are graphs 910 through 940 that illustrate example outputs from a laser based on driving functions, according to various embodiments. The horizontal axis 902 on each graph is time in relative units, increasing to the right. The vertical axis 904 on each graph is frequency in relative units, increasing upward.

FIG. 9A is a graph 910 that depicts a series of linear frequency sweeps 912 that return rapidly to a nominal starting value. Such a waveform is likely to excite mechanical resonance in one or more laser control actuators and lose stabilization. FIG. 9B is a graph 920 that depicts a series of arbitrary frequency sweeps 922 that return rapidly to a nominal starting value. Such a waveform is also likely to excite mechanical resonance in one or more laser control actuators and lose stabilization.

FIG. 9C is a graph 930 that depicts a series of nearly linear frequency sweeps 932 that gracefully returns to a nominal starting value with a reversed time waveform. To avoid sharp discontinuities in frequency tuning, the chirp rate κ is gradually decreased to zero before turning negative. FIG. 9D is a graph 940 that depicts a series of arbitrary frequency sweeps 942 that gracefully returns to a nominal starting value with a reversed time waveform and a gradual decrease or chirp rat to zero before going negative. Waveforms such as 932 and 942 are less likely to excite mechanical resonance in one or more laser control actuators and lose stabilization.

FIG. 9E depicts the non-delayed waveform 932 and the perfectly delayed waveform 934. This waveform 932 allows stabilization to be locked at all times if the reference frequency of the phase lock loop is slowly tuned during the transition from positive going to negative going waveform. The chirped waveform 932 produces a beat frequency ƒbeat that should be tuned from fa to fb to −fc, causing the chirp to smoothly go from a positive chirp to a negative chirp. Similar tuning is done at the next reversal from negative going to positive going. It is noted that the phase of fa is opposite that of fc so that tuning occurs in the opposite direction, indicated by the negative sign.

For the case of the linear chirp waveform 932, one method of stabilization has an acousto-optic modulator in one path of the reference loop 250, such as AOM 217. According to the embodiment shown in FIG. 2, the AOM 217 serves both to split the beam and frequency shift one of the paths relative to the other. Alternatively, it is possible to use another optical splitter well known in the art instead of the AOM 217, and insert an AOM in one path to perform the frequency shift. This allows for positive and negative chirp rates to be distinguished. For a particular configuration of the system, ƒbeat is greater than the AOM modulation frequency, $f_{AOM}$, for positive chirps and less than the AOM frequency for negative chirps. This ability to distinguish positive and negative chirps can also be used to shape the transition from a positive to negative chirp rate, as illustrated in FIG. 9E. To achieve a constant positive chirp, the ƒbeat is locked to reference frequency fa, which is equal to $f_{AOM}+\kappa\tau_D$. The frequency reference is set by the system electronics used as the reference in the phase lock loop. To achieve a constant negative chirp, the ƒbeat is locked to reference frequency fc, which is $f_{AOM}-\kappa\tau_D$. Note that the $f_{AOM}$ should be much greater than $\kappa\tau_D$. To transition smoothly from positive to negative chirps at the end of a sweep, the reference frequency of the stabilization system is tuned smoothly from fa to fb to fc. At fb, the frequency reference would be roughly equal to $f_{AOM}$. The opposite would be done at the bottom of the sweep to transition from negative chirp to positive chirp. Doing so will ensure that the stabilization system does not lose lock.

Active Compensation—Dispersion Effects

To address obstacle 1, enumerated above, the effects of dispersion differences between the two or more optical paths in the feedback loop should be compensated. To generate a constant linear change in the laser optical frequency the RF frequency reference from the PLL generator 221 should change in time according to Equation 3a.

$$f_{PLL}(t)=f_0+2\pi f_0^2\beta_2 t/(\beta_1^2 L_D) \quad (3a)$$

where $f_0=\alpha\tau_D$, and $\beta_1$ is the group velocity of the optical waveform, and $L_D$ is the physical length of the dispersive delay path. If instead, $f_{PLL}$ is kept constant, then the optical frequency, ν, of the laser will change nonlinearly with time as given by Equation 3b.

$$\nu(t)=\nu_0+\alpha t/(2\pi)-\alpha^2\beta_2 t^2/(4\pi\beta_1) \quad (3b)$$

In various embodiments, one or more of the following steps are taken, or components changed, to compensate for dispersion differences between the two optical paths.

In some embodiments, a dispersion compensation element 245 is placed within the time delay path that has equal magnitude, but opposite sign, as the existing delay dispersion. For instance, if the time delay 213 is due to a length of optical fiber, then one can splice onto this fiber a section of dispersion compensation fiber with the opposite sign of dispersion and appropriate length to generate zero net dispersion in the combined fiber delay. Other common forms of dispersion compensation are using diffraction gratings, prisms, and/or grisms (combinations of a prism and grating).

In some embodiments, a dispersive element 247 is placed in the non-delayed optical path. The dispersive element 247 has the same dispersion as the delay component 213 in the delay beam path. For instance, when a section of fiber is used for the time delay 213 in delayed optical path, then a shorter piece of fiber or other material with larger dispersion per unit length is used as dispersion component 247 in the non-delayed optical path. Again, a number of materials and established techniques well known in the art can be used to generate the desired dispersion compensation component 247.

In some embodiments, the AOM frequency, $\Delta\nu_{AOM}$, is programmed to follow Equation 3a to compensate for the dispersion such that $d\nu(t)/dt$ is constant. In some embodiments, the PLL generator 221 is configured to output a time-varying frequency $f_{PLL}$ that follows Equation 3a. Specifically, ƒbeat can be accurately measured as a function of time during the sweep external to the feedback loop. Then, by comparing the measured ƒbeat behavior in time to the desired ƒbeat behavior, one can determine the required modification to $f_{PLL}$ that must be implemented in order to generate the desired ƒbeat waveform in time.

In some embodiments, errors due to dispersion in the time delay lines within the feedback loop are accurately measured external to the feedback loop (e.g., as depicted in FIG. 1J), and an AOM is used external to the feedback loop, e.g. as frequency/phase actuator 205, to continuously shift the output laser frequency to compensate for the dispersion.

In some embodiments, errors due to dispersion in the time delay lines within the feedback loop are accurately measured external to the feedback loop (e.g., as depicted in FIG. 1J), and mathematical processing algorithms are used afterwards (e.g., in processor 350) to compensate for the errors in the desired optical frequency waveform for any application. This procedure is shown in practice below for a LADAR application with a single target range. Algorithms that can compensate over all range distortions can also be performed based on a method similar to the interpolation as described in the passive stabilization section, above.

Compensating for the dispersive broadening using an algorithm was demonstrated to provide Fourier transform limited peaks. However, this computational approach is computationally intensive and slows the obtaining of results. Therefore a better solution is to mitigate the effects of dispersion in the reference delay line so that a perfectly linear chirp is created. Then for typical free space path lengths, the deleterious effects of dispersive broadening would be negligible.

Experiments were performed using a dispersion compensating element. In this embodiment, the element chosen was a ruled spatial grating in an out-of-loop setup, e.g., introducing the dispersion compensating component 347a to counteract the nonlinearities in the chirp that were created by dispersion in the target path. In this way, the appropriate amount of dispersion compensation was demonstrated, while still maintaining the optical source useful to adjust the dispersion compensating element. Once the appropriate amount of dispersion compensation was identified, it could simply be added to the in-loop delay, as dispersion compensating component 245 to create precisely linearized broadband chirps.

In an experimental setup (not shown) the stable swept optical source is amplified and split. One path passes directly to a combiner (50/50 splitter). The other path travels to a grating and roof prism combination and then to a long free space path length before being coupled into a fiber and combined with the reference field. Coarse adjustment of the amount of dispersion is performed by adjusting the length between the grating and the roof prism. The roof prism is a unique approach to handling the angular deviation induced from the grating as a function of the optical frequency sweep. In essence, this portion of the optical setup allows the free space path length of the light to change as a function of the wavelength of the optical sweep. Fine adjustment of the overall amount of dispersion is performed by adjusting the long free space path length. Because the average dispersion in the total line is what matters, the path length can be adjusted to provide these fine corrections.

Figures 10A, 10B:
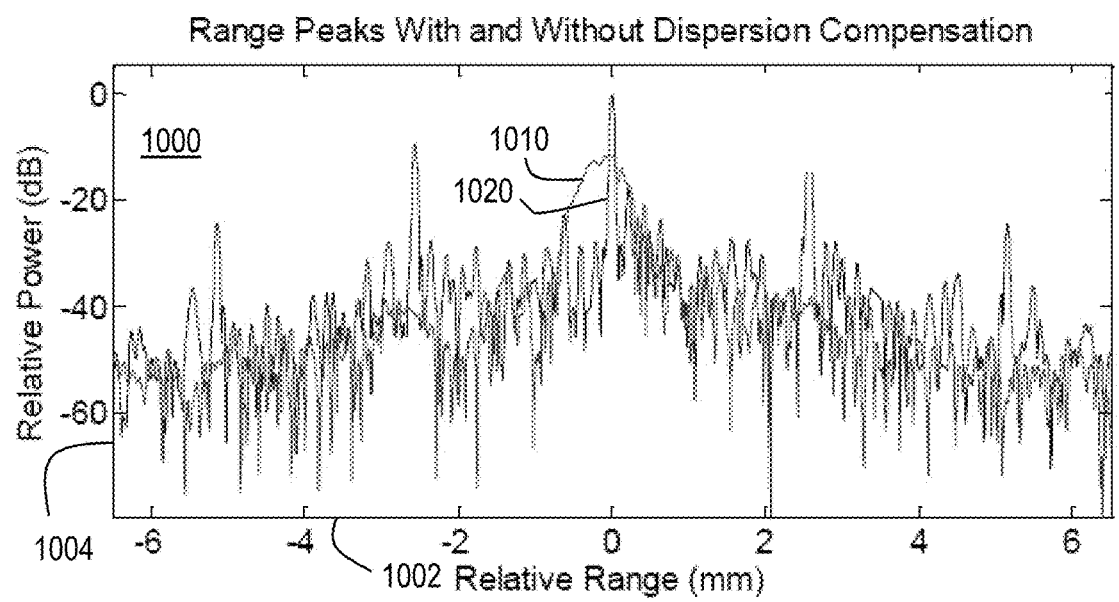
FIG. 10A is a graph that illustrates example effects on active range determination by compensating the chirp for dispersion in a reference path, according to an embodiment.
FIG. 10B is a graph that illustrates example effects on output optical frequency error by compensating the chirp for dispersion in a reference path, according to an embodiment.

Once the setup was operational, both the coarse and fine adjustments were operated to compensate for the dispersion induced nonlinearity in the optical chirps. The "residual frequency error" in the chirp passing through the target interferometer was plotted. FIG. 10A is a graph 1000 that illustrates example effects on active range determination by compensating the chirp for dispersion in a reference path, according to an embodiment. The horizontal axis 1002 is relative range in millimeters (mm); the vertical axis 1004 is relative power in decibels (dB). The Fourier transform of the heterodyne output without correction for dispersion is shown as trace 1010. The Fourier transform of the heterodyne output with the dispersion compensation component 347a is shown as trace 1020. The peak center and width are improved with the dispersion compensation.

FIG. 10B is a graph 1030 that illustrates example effects on output optical frequency error by compensating the chirp for dispersion in a reference path, according to an embodiment. Horizontal axis 1032 is time in milliseconds (ms) and the vertical axis 1034 is frequency deviations in megaHertz (MHz) from a linear chirp. Trace 1040 shows the frequency errors due to dispersion and resembles trace 186 in FIG. 1J. Trace 1040 shows a typical error that results when no dispersion compensation is applied. The dispersion compensation was determined by tuning the coarse and fine adjustments to flatten this residual error. The trace 1050 shows the result once the right path lengths were found. Overall trace 1050 is very flat with the characteristic sinusoidal errors observed out-of-loop and errors of about 2 MHz.

FIG. 10A shows a Fourier transform limited peak in trace 1020 for dispersion compensation. This is in stark contrast to the equivalent length free space delay without the dispersion compensating element of trace 1010. It is noted that the distinct side lobes near 2.5 mm and 5 mm are likely the result of a poorly mounted mirror that had a strong mechanical resonance near 100 Hz.

Polarization dispersion is identified as obstacle 2, enumerated above, and is also mitigated in some embodiments. To improve the quality of the laser stabilization, in some embodiments, only single mode optical fibers that maintain a single inserted polarization throughout the length of a fiber is used as delay component 213. It is advantageous for the inserted light polarization to match the polarization maintaining fiber axis to achieve the polarization uniformity that improves the stabilization characteristics. In some embodiments, only single mode optical fibers that are insensitive to the inserted polarization are used. The attention to polarization decreases the adverse effects of polarization mode dispersion, which can lead to multiple delays, and therefore multiple simultaneous values of $f$beat. Such multiple values of $f$beat can confound the stabilization electronics and cause errors to propagate into the laser stabilization system.

Active Compensation—Environmental Effects

Acoustic and thermal perturbations are identified as obstacle 3, enumerated above, and are also mitigated in some embodiments. Environmental perturbations to the delay path in component 213, such as temperature variations and mechanical vibrations, cause $\tau_D$ to depend on time. Again, this causes $f$beat to depend on the optical frequency sweep rate $\kappa$ in a non-linear fashion. For example, when $f$beat is held constant, a perfectly linear optical frequency sweep is expected for constant $\tau_D$. When $\tau_D$ is not constant in time, the optical frequency sweep is not linear when measured external to the feedback loop.

In some embodiments, the portion of the setup where two beams exist (one with a time delay relative to the other) between the two optical branches is thermally and acoustically isolated and protected. The most important part to isolate is the extended delay portion (e.g. fiber delay 213), but preferably the entire section where the two beams are physically separated should be isolated. This minimizes the environmental perturbations to $\tau_D$ and therefore maintains the most linear relationship between $f$beat and $\kappa$.

In some embodiments, the length of the time delay line is actively stabilized. For instance, by putting a laser with very stable frequency through both the first splitting branch and the last combining branch, changes in the delay line length are determined by measuring the resulting interferometric fringes on the optical detector. It is possible to then use a feedback loop to ensure that the measured fringes remain fixed. This ensures that the optical length of the time delay remains fixed to within at least half of the optical wavelength. The fringe maintenance system constitutes environmental compensation component 249 in this embodiment.

In some embodiments, the laser frequency is swept across multiple calibrated stable optical transitions to determine the optical sweep rate. This information can be used to feed back and stabilize the delay length. In some embodiments, the optical sweep rate is accomplished, for instance, by sweeping the laser frequency across two vapor-phase acetylene transitions in the 1550-nm wavelength region. With accurate a priori knowledge of the optical frequency separation between two acetylene transitions, and a measurement of the time taken to sweep between the two transitions, the sweep rate can be obtained by simply dividing the optical bandwidth by the time taken. Errors in the chirp rate are fed back to the delay length to correct for slowly varying delay length changes. The multiple calibrated stable optical transitions and feedback constitute environmental compensation component 249 in this embodiment.

Active Compensation—Separation of Actuator Driving Signals

Error signals that exceed the response or optical frequencies of an actuator are identified as obstacle 4, enumerated above, and are also mitigated in some embodiments. For example, driving different actuators 209a, 209b and 209c with different portions of the error signal, as described above.

For relatively narrowband optical frequency waveforms (<50 GHz), fast and non-mechanical or non-moving optical frequency actuators can be used to achieve stabilization. These actuators include, but are not limited to, laser injection current (e.g., 209a) or the intracavity electro-optic modulators (EOM, e.g., 209b) or electronic tuning of an intracavity waveguide grating (as in the case of lasers like a distributed feedback laser, not shown). For these actuators, the responses can be very rapid, but the optical frequency actuation ranges are typically limited to <50 GHz. To achieve continuous mode-hop-free tuning over much larger ranges (>1 THz), it is advantageous to utilize additional feedback actuators with larger tuning ranges but typically slower responses to provide coarse corrections to the optical frequency sweep and therefore ensure that the fast actuators remain within their allowable tuning ranges. In this way, the very fast actuators are used to perform small corrections at higher feedback bandwidths, while slower actuators are used to suppress larger errors in the optical frequency waveform at lower frequencies.

For instance, when stabilizing with the injection current to correct the laser frequency, typical diode lasers give less than 100 MHz per milliAmpere (mA, 1 mA=$10^{-3}$ Amperes). Even though one can often achieve 1 MHz closed loop correction bandwidths, correction ranges are typically limited to less than 1 GHz to keep the diode in a safe operating region. To correct the larger fluctuations that often occur at lower radio frequencies, and keep the laser current within its safe operating range, a piezo-electric transducer is used in some embodiments to tune the laser's frequency. Such an element can often tune over greater than 10 GHz, but its closed loop bandwidth is typically limited to a few kiloHertz. For even larger and slower errors, a mechanical motor that changes the laser frequency can be used to keep the piezo-electric element within its range.

Error signals that exceed the bandwidth of a tunable laser actuator are identified as obstacle 7, enumerated above, and are also mitigated in some embodiments. When controlling the optical frequency and phase of the laser, the speed and range of intracavity optical frequency and phase actuators can be limited. Therefore, optical frequency and phase actuators 241 external to the laser cavity, located between the laser 207 and the splitting optical branch AOM 217 or (not shown) between the combining optical branch and the optical detector 215, can be used to improve stabilization. For instance, both an AOM and an EOM can be used as the frequency/phase actuator 241. These frequency and phase actuators can be used to make corrections to the errors in the optical frequency waveform.

Error signals that exceed the frequency response magnitude of a tunable laser actuator are identified as obstacle 8, enumerated above, and are also mitigated in some embodiments. Thus, in some embodiments, the laser actuators are driven at the actuator's resonant frequency. This allows small input signal amplitudes to produce large optical frequency ranges at relatively fast speeds in a controlled manner. The even faster actuators then provide corrections to the errors in the optical frequency waveform. For instance, if a motor is used to tune the optical frequency of a laser and the motor/tuning arm is known to have a resonance at 100 Hz, then one can drive the motor at 100 Hz for repetitive scans. This will require less voltage or power to the motor in order to achieve a larger tuning modulation.

FIG. 11A is a graph 1100 that illustrates an example broadband precise chirp, according to an embodiment. The horizontal axis 1102 is time in milliseconds (ms); the vertical axis 1104a is optical absolute frequency in TeraHertz (THz) and the parallel vertical axis 1104b is relative Frequency from a reference, also in TeraHertz (THz). Trace 1106 shows a highly linearized chirp over a large bandwidth of 4.8 THz achieved by a combination of the elements and method described above.

FIG. 11B is a graph that illustrates deviations from an ideal chirp output, according to an embodiment. The horizontal axis is time in milliseconds (ms) 1102; and the vertical axis 1114 is frequency deviation from linear in megahertz (MHz). Trace 1120 shows very small deviations for the trace 1106 from a perfect linear chirp, with a mean 1122 near zero, and minus and plus one standard deviations at 1124a and 1124b, respectively, of about 0.17 MHz. This is an error of 0.17 MHz from linearity over the 4.8 THz bandwidth of 0.035 parts per million (ppm).

Figure 11D:
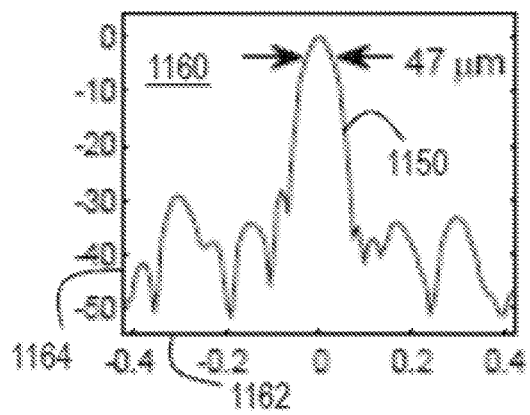

FIG. 11C and FIG. 11D are graphs that illustrate example effects on active range determination by compensating chirp for multiple contributions to non-linearity, according to an embodiment. In graph 1130 of FIG. 11C, the horizontal axis 1132 is relative range in millimeters (mm); and the vertical axis 1134 is relative power in decibels (dB). The light trace 1140 represents the range peak measured using a 50 meter out of loop fiber without active linearization. The dark trace 1150 represents the range peak measured with active linearization. FIG. 11D is a graph 1160 of an expanded view of the peak of trace 1150. The horizontal axis 1162 in millimeters, and the vertical axis 1164 is relative power in decibels (dB). The peak of trace 1150 has a width at 3 dB of 47 micrometers (μm).

Thus, the effectiveness of the frequency chirp linearization is shown in FIG. 11C. This figure shows the Hanning-filtered Fourier transform of the digitized beat note with the horizontal axis scaled to provide relative target range at an effective range of 37 m. The beat note is shown both before (trace 1140) and after (trace 1150) the feedback loop is engaged. For both cases, the systematic nonlinearities were suppressed as described above. However, the active stabilization provided a reduction in the range peak width of an additional 4 orders of magnitude, to 47 mm (FWHM) with the Hanning filter (31 mm without). This matches the Fourier transform limit dictated by the optical bandwidth (4.8 THz) and to the authors' knowledge represents the narrowest LADAR range resolution ever achieved over a range window greater than 1 cm. This system is therefore very attractive for precision industrial metrology.

Experimental LADAR Embodiments

Figure 12A:
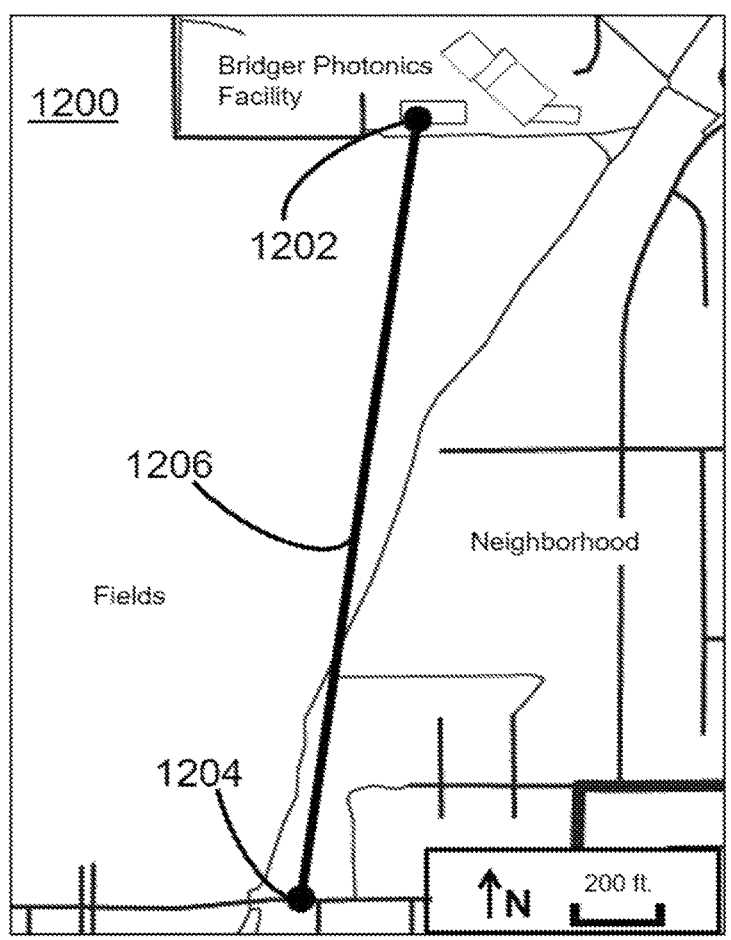
FIG. 12A is an image that illustrates an example medium distance ranging experiment with a precise broadband chirp, according to an embodiment.

FIG. 12A is an image 1200 that illustrates an example medium distance ranging experiment with a precise broadband chirp, according to an embodiment. The source is located at point 1202, the target at point 1204 separated by an optical path 1206 of about 800 meters. The range, measured by GPS, was 776±3 m. The elevation change was negligible. The experimental setup follows the LADAR 300 depicted in FIG. 3.

Figure 12B:
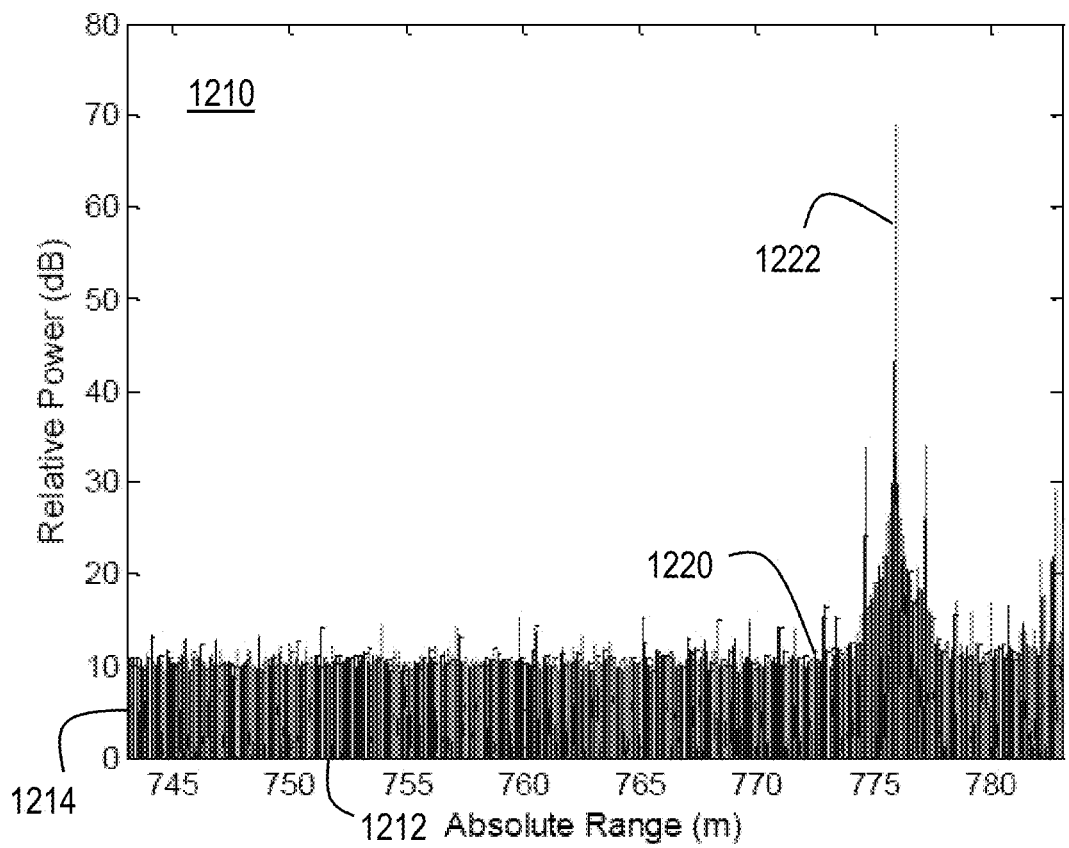
FIG. 12B is a graph that illustrates an example experimental ranging result with a precise broadband chirp, according to an embodiment.

FIG. 12B is a graph that illustrates an example experimental ranging result with a precise broadband chirp, according to an embodiment. The horizontal axis 1212 is absolute range in meters (m). The vertical axis 1214 is relative power in deciBels (dB). In this experimental setup, the time delay through the reference fiber delay line 325 was measured to be 6.685 micro seconds (μs, 1 μs=$10^{-6}$ seconds), which corresponds to a range offset of 782.76 m. The trace 1220 shows the Fourier transform of the beat frequency observed at detector 340.

Using the measured delay of the fibers in the reference path, the distance to target measured by the LADAR system is 774.1 m. It is noted that the target range is less than the range offset of the fiber delay. This measurement is within the accuracy of the GPS. For a transmit power of 100 milliWatts (mW), the average return optical power was measured to be 0.3 mW. The reference optical power was 0.2 mW. For this embodiment, the average signal to noise ratio (SNR) was measured to be 74.8 dB.

Figure 12C:
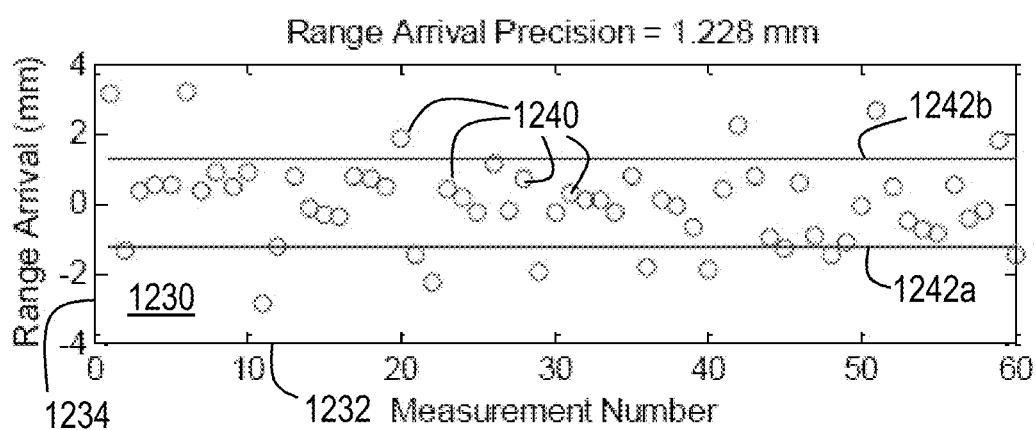
FIG. 12C is a graph that illustrates an example experimental absolute range error with a precise broadband chirp, according to an embodiment.

FIG. 12C is a graph that illustrates an example experimental absolute range error with a precise broadband chirp, according to an embodiment. The horizontal axis 1232 is measurement number; and the vertical axis 1234 is range arrival deviations in millimeters (mm) The observed deviations from the average distance are plotted as points 1240. The range precision was measured to be 1.2 mm. Therefore, target displacement of <1 cm is easily measurable. The degradation in range precision at this distance is due to both vibrations in the apparatus and atmospheric turbulence along the path 1206.

Figure 13A:
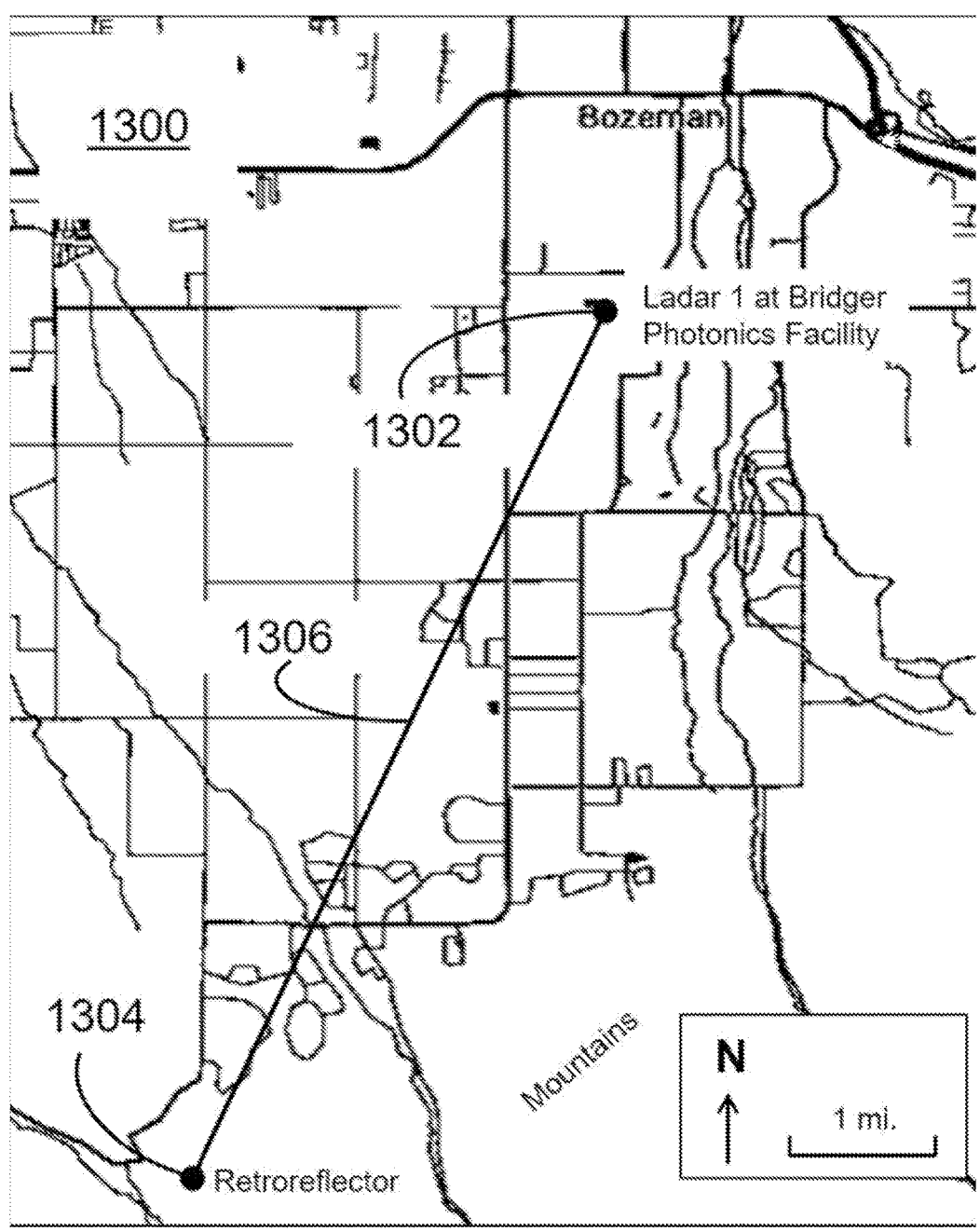
FIG. 13A is an image that illustrates an example long distance ranging experiment with a precise broadband chirp, according to an embodiment.

FIG. 13A is an image 1300 that illustrates an example long distance ranging experiment with a precise broadband chirp, according to an embodiment. The source is located at point 1302, the target at point 130 separated by an optical path 1306 of about 14 kilometers. The range, measured by GPS, was 14.08 kilometers. The elevation change was measured to be 0.649 km, yielding a total distance to target of 14.095 km. The nominal delay of the reference delay fiber 325 was measured to be 14.118 km and the measured value was 14.154 km. The data was taken pre-dawn to minimize the effects of atmospheric turbulence.

Using these values, the measured absolute range to target was 14.124 km. The average SNR was measured to be 59.5 dB and the range precision was measured to be 1.446 mm. At this distance, this represents a precision of 1 part in 10 million. As with previous demonstrations, the transmit power was 100 mW. The return power was not measured, but is estimated to be 5 to 10 microWatts (μW, 1 μW=$10^{-6}$ Watts). The reference power was 0.15 mW.

A second demonstration at the 14 km range was performed. In this embodiment, the optical amplifier was removed from the system. This reduced the reference power to 3 to 4 μW. The return power should be reduced by the same factor and is thereby estimated to be 0.2 to 0.4 μW. Under these extreme conditions, the system was able to achieve an average SNR of 31.4 dB.

Figure 13B:
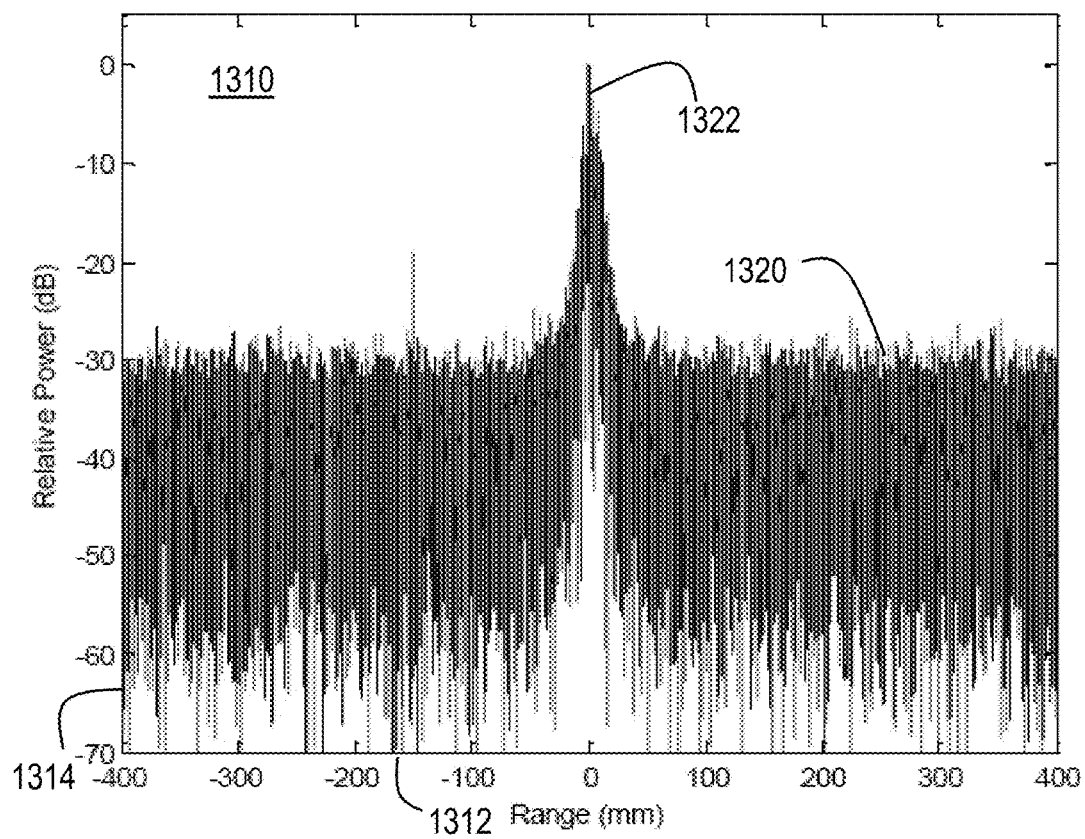
FIG. 13B is a graph that illustrates an example long distance experimental relative range result with a precise broadband chirp, according to an embodiment.

FIG. 13B is a graph 1310 that illustrates an example long distance experimental relative range result with a precise broadband chirp, according to an embodiment. The horizontal axis 1312 is relative range in millimeters (mm). The vertical axis 1314 is relative power in deciBels (dB). The trace 1320 is the Fourier transform of the beat signal received at detector 340, showing a peak 1322. Again, the measured absolute range to target was 14.124 km.

Figure 13C:
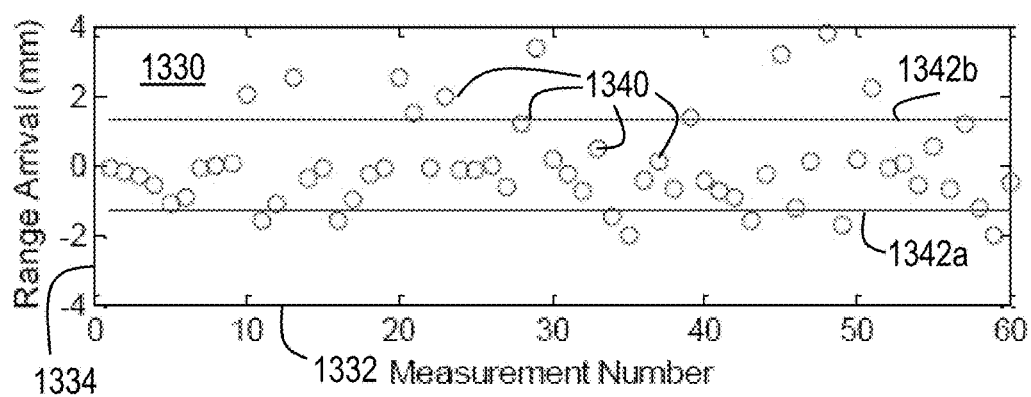
FIG. 13C is a graph that illustrates an example long distance experimental range errors with a precise broadband chirp, according to an embodiment.

FIG. 13C is a graph 1330 that illustrates an example long distance experimental range errors with a precise broadband chirp, according to an embodiment. The horizontal axis 1332 is measurement number; and the vertical axis 1334 is range arrival deviations in millimeters (mm). The observed deviations from the average distance are plotted as points 1340 with minus one standard deviation 1342a and plus one standard deviation 1342b lines drawn. The range precision was measured to be 1.32 mm. Therefore, target displacement of <1 cm is easily measureable. The degradation in range precision at this distance is due to both vibrations in the apparatus and atmospheric turbulence along the path 1306.

Controller Equipment Review

The processes described herein for controlling and using a precise broadband optical waveform may be implemented via software, hardware (e.g., general processor, Digital Signal Processing (DSP) chip, an Application Specific Integrated Circuit (ASIC), Field Programmable Gate Arrays (FPGAs), etc.), firmware, other means, or a combination thereof. Such example hardware for performing the described functions is detailed below.

Figure 14:
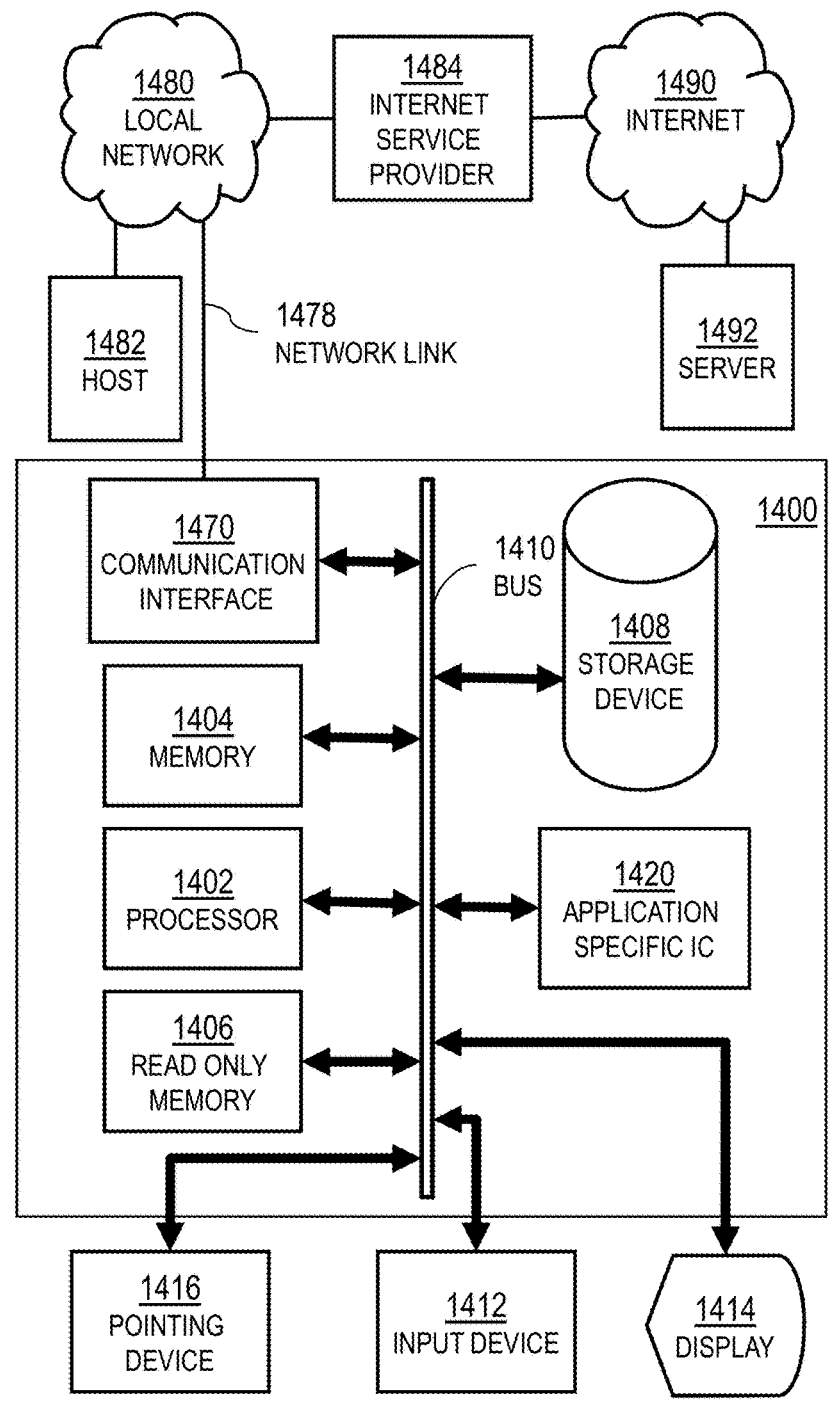
FIG. 14 is a diagram of hardware that can be used to implement an embodiment of the invention.

FIG. 14 illustrates a computer system 1400 upon which an embodiment of the invention may be implemented. Computer system 1400 includes a communication mechanism such as a bus 1410 for passing information between other internal and external components of the computer system 1400. Information (also called data) is represented as a physical expression of a measurable phenomenon, typically electric voltages, but including, in other embodiments, such phenomena as magnetic, electromagnetic, pressure, chemical, biological, molecular, atomic, sub-atomic and quantum interactions. For example, north and south magnetic fields, or a zero and non-zero electric voltage, represent two states (0, 1) of a binary digit (bit). Other phenomena can represent digits of a higher base. A superposition of multiple simultaneous quantum states before measurement represents a quantum bit (qubit). A sequence of one or more digits constitutes digital data that is used to represent a number or code for a character. In some embodiments, information called analog data is represented by a near continuum of measurable values within a particular range.

A bus 1410 includes one or more parallel conductors of information so that information is transferred quickly among devices coupled to the bus 1410. One or more processors 1402 for processing information are coupled with the bus 1410.

A processor 1402 performs a set of operations on information. The set of operations include bringing information in from the bus 1410 and placing information on the bus 1410. The set of operations also typically include comparing two or more units of information, shifting positions of units of information, and combining two or more units of information, such as by addition or multiplication or logical operations like OR, exclusive OR (XOR), and AND. Each operation of the set of operations that can be performed by the processor is represented to the processor by information called instructions, such as an operation code of one or more digits. A sequence of operations to be executed by the processor 1402, such as a sequence of operation codes, constitute processor instructions, also called computer system instructions or, simply, computer instructions. Processors may be implemented as mechanical, electrical, magnetic, optical, chemical or quantum components, among others, alone or in combination.

Computer system 1400 also includes a memory 1404 coupled to bus 1410. The memory 1404, such as a random access memory (RAM) or other dynamic storage device, stores information including processor instructions. Dynamic memory allows information stored therein to be changed by the computer system 1400. RAM allows a unit of information stored at a location called a memory address to be stored and retrieved independently of information at neighboring addresses. The memory 1404 is also used by the processor 1402 to store temporary values during execution of processor instructions. The computer system 1400 also includes a read only memory (ROM) 1406 or other static storage device coupled to the bus 1410 for storing static information, including instructions, that is not changed by the computer system 1400. Some memory is composed of volatile storage that loses the information stored thereon when power is lost. Also coupled to bus 1410 is a non-volatile (persistent) storage device 1408, such as a magnetic disk, optical disk or flash card, for storing information, including instructions, that persists even when the computer system 1400 is turned off or otherwise loses power.

Information, including instructions, is provided to the bus 1410 for use by the processor from an external input device 1412, such as a keyboard containing alphanumeric keys operated by a human user, or a sensor. A sensor detects conditions in its vicinity and transforms those detections into physical expression compatible with the measurable phenomenon used to represent information in computer system 1400. Other external devices coupled to bus 1410, used primarily for interacting with humans, include a display device 1414, such as a cathode ray tube (CRT) or a liquid crystal display (LCD), or plasma screen or printer for presenting text or images, and a pointing device 1416, such as a mouse or a trackball or cursor direction keys, or motion sensor, for controlling a position of a small cursor image presented on the display 1414 and issuing commands associated with graphical elements presented on the display 1414. In some embodiments, for example, in embodiments in which the computer system 1400 performs all functions automatically without human input, one or more of external input device 1412, display device 1414 and pointing device 1416 is omitted.

In the illustrated embodiment, special purpose hardware, such as an application specific integrated circuit (ASIC) 1420, is coupled to bus 1410. The special purpose hardware is configured to perform operations not performed by processor 1402 quickly enough for special purposes. Examples of application specific ICs include graphics accelerator cards for generating images for display 1414, cryptographic boards for encrypting and decrypting messages sent over a network, speech recognition, and interfaces to special external devices, such as robotic arms and medical scanning equipment that repeatedly perform some complex sequence of operations that are more efficiently implemented in hardware.

Computer system 1400 also includes one or more instances of a communications interface 1470 coupled to bus 1410. Communication interface 1470 provides a one-way or two-way communication coupling to a variety of external devices that operate with their own processors, such as printers, scanners and external disks. In general the coupling is with a network link 1478 that is connected to a local network 1480 to which a variety of external devices with their own processors are connected. For example, communication interface 1470 may be a parallel port or a serial port or a universal serial bus (USB) port on a personal computer. In some embodiments, communications interface 1470 is an integrated services digital network (ISDN) card or a digital subscriber line (DSL) card or a telephone modem that provides an information communication connection to a corresponding type of telephone line. In some embodiments, a communication interface 1470 is a cable modem that converts signals on bus 1410 into signals for a communication connection over a coaxial cable or into optical signals for a communication connection over a fiber optic cable. As another example, communications interface 1470 may be a local area network (LAN) card to provide a data communication connection to a compatible LAN, such as Ethernet. Wireless links may also be implemented. For wireless links, the communications interface 1470 sends or receives or both sends and receives electrical, acoustic or electromagnetic signals, including infrared and optical signals, which carry information streams, such as digital data. For example, in wireless handheld devices, such as mobile telephones like cell phones, the communications interface 1470 includes a radio band electromagnetic transmitter and receiver called a radio transceiver.

The term computer-readable medium is used herein to refer to any medium that participates in providing information to processor 1402, including instructions for execution. Such a medium may take many forms, including, but not limited to, non-volatile media, volatile media and transmission media. Non-volatile media include, for example, optical or magnetic disks, such as storage device 1408. Volatile media include, for example, dynamic memory 1404. Transmission media include, for example, coaxial cables, copper wire, fiber optic cables, and carrier waves that travel through space without wires or cables, such as acoustic waves and electromagnetic waves, including radio, optical and infrared waves. Signals include man-made transient variations in amplitude, frequency, phase, polarization or other physical properties transmitted through the transmission media.

Common forms of computer-readable media include, for example, a floppy disk, a flexible disk, a hard disk, a magnetic tape, or any other magnetic medium, a compact disk ROM (CD-ROM), a digital video disk (DVD) or any other optical medium, punch cards, paper tape, or any other physical medium with patterns of holes, a RAM, a programmable ROM (PROM), an erasable PROM (EPROM), a FLASH-EPROM, or any other memory chip or cartridge, a transmission medium such as a cable or carrier wave, or any other medium from which a computer can read. Information read by a computer from computer-readable media are variations in physical expression of a measurable phenomenon on the computer readable medium. Computer-readable storage medium is a subset of computer-readable medium which excludes transmission media that carry transient man-made signals.

Logic encoded in one or more tangible media includes one or both of processor instructions on a computer-readable storage media and special purpose hardware, such as ASIC 1420.

Network link 1478 typically provides information communication using transmission media through one or more networks to other devices that use or process the information. For example, network link 1478 may provide a connection through local network 1480 to a host computer 1482 or to equipment 1484 operated by an Internet Service Provider (ISP). ISP equipment 1484 in turn provides data communication services through the public, world-wide packet-switching communication network of networks now commonly referred to as the Internet 1490. A computer called a server host 1492 connected to the Internet hosts a process that provides a service in response to information received over the Internet. For example, server host 1492 hosts a process that provides information representing video data for presentation at display 1414.

At least some embodiments of the invention are related to the use of computer system 1400 for implementing some or all of the techniques described herein. According to one embodiment of the invention, those techniques are performed by computer system 1400 in response to processor 1402 executing one or more sequences of one or more processor instructions contained in memory 1404. Such instructions, also called computer instructions, software and program code, may be read into memory 1404 from another computer-readable medium such as storage device 1408 or network link 1478. Execution of the sequences of instructions contained in memory 1404 causes processor 1402 to perform one or more of the method steps described herein. In alternative embodiments, hardware, such as ASIC 1420, may be used in place of or in combination with software to implement the invention. Thus, embodiments of the invention are not limited to any specific combination of hardware and software, unless otherwise explicitly stated herein.

The signals transmitted over network link 1478 and other networks through communications interface 1470, carry information to and from computer system 1400. Computer system 1400 can send and receive information, including program code, through the networks 1480, 1490 among others, through network link 1478 and communications interface 1470. In an example using the Internet 1490, a server host 1492 transmits program code for a particular application, requested by a message sent from computer 1400, through Internet 1490, ISP equipment 1484, local network 1480 and communications interface 1470. The received code may be executed by processor 1402 as it is received, or may be stored in memory 1404 or in storage device 1408 or other non-volatile storage for later execution, or both. In this manner, computer system 1400 may obtain application program code in the form of signals on a carrier wave.

Various forms of computer readable media may be involved in carrying one or more sequence of instructions or data or both to processor 1402 for execution. For example, instructions and data may initially be carried on a magnetic disk of a remote computer such as host 1482. The remote computer loads the instructions and data into its dynamic memory and sends the instructions and data over a telephone line using a modem. A modem local to the computer system 1400 receives the instructions and data on a telephone line and uses an infra-red transmitter to convert the instructions and data to a signal on an infra-red carrier wave serving as the network link 1478. An infrared detector serving as communications interface 1470 receives the instructions and data carried in the infrared signal and places information representing the instructions and data onto bus 1410. Bus 1410 carries the information to memory 1404 from which processor 1402 retrieves and executes the instructions using some of the data sent with the instructions. The instructions and data received in memory 1404 may optionally be stored on storage device 1408, either before or after execution by the processor 1402.

Figure 15:
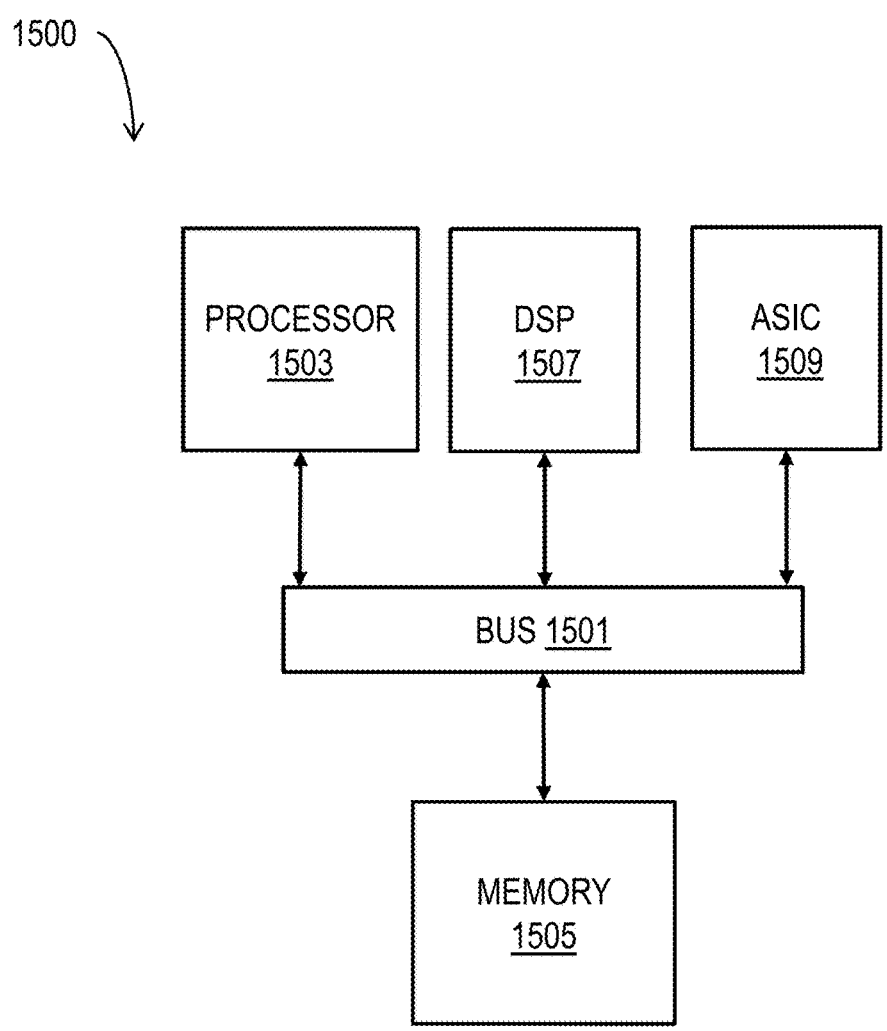
FIG. 15 is a diagram of a chip set that can be used to implement an embodiment of the invention.

FIG. 15 illustrates a chip set or chip 1500 upon which an embodiment of the invention may be implemented. Chip set 1500 is programmed to control or use a precise broadband optical waveform as described herein and includes, for instance, the processor and memory components described with respect to FIG. 14 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set 1500 can be implemented in a single chip. It is further contemplated that in certain embodiments the chip set or chip 1500 can be implemented as a single "system on a chip." It is further contemplated that in certain embodiments a separate ASIC would not be used, for example, and that all relevant functions as disclosed herein would be performed by a processor or processors. Chip set or chip 1500, or a portion thereof, constitutes a means for performing one or more steps of providing user interface navigation information associated with the availability of services. Chip set or chip 1500, or a portion thereof, constitutes a means for performing one or more steps to control or use a precise broadband optical waveform.

In one embodiment, the chip set or chip 1500 includes a communication mechanism such as a bus 1501 for passing information among the components of the chip set 1500. A processor 1503 has connectivity to the bus 1501 to execute instructions and process information stored in, for example, a memory 1505. The processor 1503 may include one or more processing cores with each core configured to perform independently. A multi-core processor enables multiprocessing within a single physical package. Examples of a multi-core processor include two, four, eight, or greater numbers of processing cores. Alternatively or in addition, the processor 1503 may include one or more microprocessors configured in tandem via the bus 1501 to enable independent execution of instructions, pipelining, and multithreading. The processor 1503 may also be accompanied with one or more specialized components to perform certain processing functions and tasks such as one or more digital signal processors (DSP) 1507, or one or more application-specific integrated circuits (ASIC) 1509. A DSP 1507 typically is configured to process real-world signals (e.g., sound) in real time independently of the processor 1503. Similarly, an ASIC 1509 can be configured to performed specialized functions not easily performed by a more general purpose processor. Other specialized components to aid in performing the inventive functions described herein may include one or more field programmable gate arrays (FPGA) (not shown), one or more controllers (not shown), or one or more other special-purpose computer chips.

In one embodiment, the chip set or chip 800 includes merely one or more processors and some software and/or firmware supporting and/or relating to and/or for the one or more processors.

The processor 1503 and accompanying components have connectivity to the memory 1505 via the bus 1501. The memory 1505 includes both dynamic memory (e.g., RAM, magnetic disk, writable optical disk, etc.) and static memory (e.g., ROM, CD-ROM, etc.) for storing executable instructions that when executed perform the inventive steps described herein to control or use a precise broadband optical waveform. The memory 1505 also stores the data associated with or generated by the execution of the inventive steps While the invention has been described in connection with a number of embodiments and implementations, the invention is not so limited but covers various obvious modifications and equivalent arrangements, which fall within the purview of the appended claims. Although features of the invention are expressed in certain combinations among the claims, it is contemplated that these features can be arranged in any combination and order.

What is claimed is:

1. An apparatus comprising:
a tunable laser having a plurality of drive inputs for affecting an optical frequency of light output by the laser, wherein the plurality of drive inputs have a corresponding plurality of different frequency response bands for changing optical properties of the tunable laser and a corresponding plurality of actuation ranges of optical frequencies affected;
a frequency sweep generator configured to drive at least one drive input of the plurality of drive inputs with a sweep signal that causes the tunable laser to output light with a time dependent optical frequency or phase spanning at least 1 gigaHertz of optical frequency bandwidth;
an optical detector;
a plurality of optical paths configured to direct light output by the laser onto the optical detector; and
a laser controller configured to provide a plurality of inputs to the plurality of drive inputs, each input of the plurality of inputs based on a detector signal output from the optical detector and a corresponding frequency response band of the plurality of different frequency response bands and a corresponding actuation range of the plurality of actuation ranges.

2. An apparatus comprising:
a tunable laser having a plurality of drive inputs for affecting an optical frequency of light output by the laser, wherein the plurality of drive inputs have a corresponding plurality of different frequency response bands for changing optical properties of the tunable laser and a corresponding plurality of actuation ranges of optical frequencies affected;
an optical detector;
a plurality of optical paths configured to direct light output by the laser onto the optical detector; and
a laser controller configured to provide a plurality of inputs to the plurality of drive inputs based on a detector signal output from the optical detector and the corresponding frequency response bands actuation ranges,
wherein:
the apparatus further comprises external to the tunable laser an optical actuator configured to affect the optical frequency of light transmitted into the plurality of optical paths based on a signal input to the optical actuator; and
the laser controller is further configured to provide the signal input to the optical actuator based on the detector signal output from the optical detector and a frequency response band and actuation range for the optical actuator.

3. An apparatus comprising:
a laser,
an optical detector;
a plurality of optical paths configured to direct light output by the laser onto the detector;
an optical actuator in an optical path between the laser and the plurality of optical paths, the optical actuator configured to affect the optical frequency of light transmitted into the plurality of optical paths based on a first signal input to the optical actuator; and a laser controller configured to provide the first signal input to the optical actuator based on the detector signal output from the optical detector,
wherein
the optical actuator has an actuator frequency response band for changing optical properties of the light transmitted into the plurality of optical paths and an actuator actuation range of optical frequencies affected; and,
the laser controller is further configured to provide the first signal input to the optical actuator based on the actuator frequency response band and the actuator actuation range of the optical actuator.

4. An apparatus as recited in claim 3, wherein:
the laser comprises a tunable laser having a drive input for affecting an optical frequency of light output by the tunable laser; and,
the laser controller is further configured to provide a second signal input to the drive input based on the detector signal output from the optical detector.

5. An apparatus as recited in claim 4, wherein:
the drive input has a drive frequency response band for changing optical properties of light output by the tunable laser and a drive actuation range of optical frequencies affected; and,
the laser controller is further configured to provide the second signal input to the drive input based on the drive frequency response band and the drive actuation range of the drive input.

6. A method for producing a laser beam with constant rate of change over large bandwidth, comprising:
generating from a beam of a laser, a processed beam having a time varying intensity, the time variation of the processed beam's intensity being a function of the time rate of change of the frequency of the laser, further comprising
splitting the beam from the laser into first and second beam portions which traverse different optical paths with different travel times for a same optical frequency, and
combining said first and second beam portions after the first and second beam portions have traversed the different optical paths, wherein the processed beam comprises said combined beam portions;
deriving, from said time variation, a signal that is a function of the time rate of change of the frequency of the beam of the laser;
filtering the derived signal into a plurality of filtered signals in a corresponding plurality of actuation ranges for a corresponding plurality of actuators that affect a frequency of the beam of the laser; and
employing the plurality of filtered signals as loopback to the plurality of actuators to stabilize the rate of change of the frequency of the beam of the laser.

7. A method for producing a laser beam with desired time rate of change of optical frequency over large optical bandwidth, comprising:
generating a beam of a laser comprising a series of alternating increasing and decreasing optical frequencies of a desired large optical bandwidth;
generating from the beam of the laser, a processed beam having a time varying intensity, the time variation of the processed beam's intensity being a function of the time rate of change of the frequency of the laser, further comprising splitting the beam of the laser into first and second beam portions which traverse different optical paths with different travel times for a same optical frequency, and combining said first and second beam portions after the first and second beam portions have traversed the different optical paths, wherein the processed beam comprises said combined beam portions;

deriving, from said time variation, a signal that is a function of the time rate of change of the frequency of the beam of the laser; and employing the derived signal as loopback to stabilize the rate of change of the frequency of the laser.

8. An apparatus comprising:

a tunable laser having a drive input for affecting an optical frequency of light output by the tunable laser wherein the drive input has a drive frequency response band for changing optical properties of light output by the tunable laser and a drive actuation range of optical frequencies affected;

an optical detector;

a plurality of optical paths configured to direct light output by the laser onto the detector;

an optical actuator in an optical path between the laser and the plurality of optical paths, the optical actuator configured to affect the optical frequency of light transmitted into the plurality of optical paths based on a first signal input to the optical actuator; and a laser controller configured to provide the first signal input to the optical actuator based on the detector signal output from the optical detector and configured to provide a second signal input to the drive input based on the detector signal output from the optical detector and the drive actuation range of the drive input.

* * * * *